(12) United States Patent
Boysel et al.

(10) Patent No.: US 10,214,414 B2
(45) Date of Patent: Feb. 26, 2019

(54) INTEGRATED MEMS SYSTEM

(71) Applicant: Motion Engine, Inc., Montreal (CA)

(72) Inventors: Robert Mark Boysel, Montreal (CA); Louis Ross, Montreal (CA)

(73) Assignee: Motion Engine, Inc., Montreal (CA)

( * ) Notice: Subject to any disclaimer, the term of this patent is extended or adjusted under 35 U.S.C. 154(b) by 184 days.

(21) Appl. No.: 15/206,935

(22) Filed: Jul. 11, 2016

(65) Prior Publication Data
US 2016/0320426 A1    Nov. 3, 2016

Related U.S. Application Data

(63) Continuation-in-part of application No. PCT/CA2014/051245, filed on Dec. 22, 2014.
(Continued)

(51) Int. Cl.
*B81B 7/00* (2006.01)
*G01P 15/125* (2006.01)
(Continued)

(52) U.S. Cl.
CPC .......... *B81B 7/007* (2013.01); *B81C 1/00238* (2013.01); *G01P 15/0802* (2013.01); *G01P 15/125* (2013.01); *G01P 15/18* (2013.01); *B81B 2201/0235* (2013.01); *B81B 2201/0242* (2013.01); *B81B 2201/0257* (2013.01); *B81B 2201/0264* (2013.01);
(Continued)

(58) Field of Classification Search
CPC ...... G01P 15/02; G01P 15/08; G01P 15/0802; G01P 15/0862; G01P 15/0865; G01P 15/0877; B81B 7/007; B81B 7/02; B81B 2201/0228; B81B 2201/0264; B81B 2207/012; B81B 2207/07
USPC ......................................... 73/514.01, 514.16
See application file for complete search history.

(56) References Cited

U.S. PATENT DOCUMENTS

| | | | |
|---|---|---|---|
| 4,430,895 | A | 2/1984 | Colton |
| 4,483,194 | A | 11/1984 | Rudolf |

(Continued)

FOREIGN PATENT DOCUMENTS

| | | |
|---|---|---|
| EP | 1802952 A1 | 7/2007 |
| EP | 2410344 A2 | 1/2012 |

(Continued)

OTHER PUBLICATIONS

Boysel, A Single-Proof-Mass MEMS Multi-Axis Motion Sensor. Semicon Japan. 6 pages. (2008).

(Continued)

*Primary Examiner* — Benjamin R Schmitt
(74) *Attorney, Agent, or Firm* — McCarter & English, LLP; Thomas O. Hoover

(57) ABSTRACT

An integrated MEMS system having a MEMS chip, including a MEMS transducer, and at least one IC chip, including MEMS processing circuitry, and additional circuitry to process electrical signals. The MEMS chip can include first and second insulated conducting pathways. The first pathways conduct the MEMS-signals between the transducer and the IC chip, for processing; and the second conducting pathways can extend through the entire thickness of the MEMS chip, to conduct electrical signals to the IC chip, to be processed by additional circuitry.

24 Claims, 11 Drawing Sheets

Related U.S. Application Data

(60) Provisional application No. 61/925,379, filed on Jan. 9, 2014.

(51) Int. Cl.
  *G01P 15/18* (2013.01)
  *G01P 15/08* (2006.01)
  *B81C 1/00* (2006.01)

(52) U.S. Cl.
  CPC ........... *B81B 2201/0278* (2013.01); *B81B 2201/0292* (2013.01); *B81B 2207/012* (2013.01); *B81B 2207/07* (2013.01); *H01L 2224/16145* (2013.01)

(56) References Cited

U.S. PATENT DOCUMENTS

| | | |
|---|---|---|
| 4,553,436 A | 11/1985 | Hansson |
| 4,805,456 A | 2/1989 | Howe et al. |
| 4,833,417 A | 5/1989 | Schroeder |
| 4,881,408 A | 11/1989 | Hulsing, II et al. |
| 4,882,933 A | 11/1989 | Petersen et al. |
| 4,905,523 A | 3/1990 | Okada |
| 4,967,605 A | 11/1990 | Okada |
| 5,359,893 A | 11/1994 | Dunn |
| 5,557,046 A | 9/1996 | Hulsing, II |
| 5,596,144 A | 1/1997 | Swanson |
| 5,614,742 A | 3/1997 | Gessner et al. |
| 5,646,346 A | 7/1997 | Okada |
| 5,831,163 A | 11/1998 | Okada |
| 5,894,090 A | 4/1999 | Tang et al. |
| 5,895,850 A | 4/1999 | Buestgens |
| 5,898,223 A | 4/1999 | Frye et al. |
| 5,920,011 A | 7/1999 | Hulsing, II |
| 5,959,206 A | 9/1999 | Ryrko et al. |
| 5,962,784 A | 10/1999 | Hulsing, II |
| 5,977,640 A | 11/1999 | Bertin et al. |
| 5,987,985 A | 11/1999 | Okada |
| 6,003,371 A | 12/1999 | Okada |
| 6,028,773 A | 2/2000 | Hundt |
| 6,053,057 A | 4/2000 | Okada |
| 6,058,778 A | 5/2000 | Chan et al. |
| 6,079,272 A | 6/2000 | Stell et al. |
| 6,090,638 A | 7/2000 | Vigna et al. |
| 6,091,132 A | 7/2000 | Bryant |
| 6,119,517 A | 9/2000 | Breng et al. |
| 6,122,961 A | 9/2000 | Geen et al. |
| 6,159,773 A | 12/2000 | Lin |
| 6,184,052 B1 | 2/2001 | Vigna et al. |
| 6,225,699 B1 | 5/2001 | Ference et al. |
| 6,235,550 B1 | 5/2001 | Chan et al. |
| 6,257,057 B1 | 7/2001 | Hulsing, II |
| 6,282,956 B1 | 9/2001 | Okada |
| 6,295,870 B1 | 10/2001 | Hulsing, II |
| 6,391,673 B1 | 5/2002 | Ha et al. |
| 6,399,997 B1 | 6/2002 | Lin et al. |
| 6,469,330 B1 | 10/2002 | Vigna et al. |
| 6,487,000 B2 | 11/2002 | Mastromatteo et al. |
| 6,490,923 B1 | 12/2002 | Breng et al. |
| 6,508,124 B1 | 1/2003 | Zerbini et al. |
| 6,539,801 B1 | 4/2003 | Gutierrez et al. |
| 6,584,845 B1 | 7/2003 | Gutierrez et al. |
| 6,587,312 B2 | 7/2003 | Murari et al. |
| 6,621,137 B1 | 9/2003 | Ma et al. |
| 6,651,500 B2 | 11/2003 | Stewart et al. |
| 6,675,630 B2 | 1/2004 | Challoner et al. |
| 6,696,364 B2 | 2/2004 | Gelmi et al. |
| 6,701,786 B2 | 3/2004 | Hulsing, II |
| 6,705,167 B2 | 3/2004 | Kvisteroey et al. |
| 6,715,353 B2 | 4/2004 | Johnson |
| 6,766,689 B2 | 7/2004 | Spinola Durante et al. |
| 6,772,632 B2 | 8/2004 | Okada |
| 6,808,952 B1 | 10/2004 | Sniegowski et al. |
| 6,808,955 B2 | 10/2004 | Ma |
| 6,829,937 B2 | 12/2004 | Mahon |
| 6,841,861 B2 | 1/2005 | Brady |
| 6,856,144 B2 | 2/2005 | Lasalandra et al. |
| 6,863,832 B1 | 3/2005 | Wiemer et al. |
| 6,865,943 B2 | 3/2005 | Okada |
| 6,892,575 B2 | 5/2005 | Nasiri et al. |
| 6,925,875 B2 | 8/2005 | Silverbrook |
| 6,939,473 B2 | 9/2005 | Nasiri et al. |
| 6,942,750 B2 | 9/2005 | Chou et al. |
| 6,944,931 B2 | 9/2005 | Shcheglov et al. |
| 6,953,985 B2 | 10/2005 | Lin et al. |
| 6,990,863 B2 | 1/2006 | Challoner et al. |
| 6,991,957 B2 | 1/2006 | Eskridge |
| 6,993,617 B2 | 1/2006 | Butcher et al. |
| 7,017,410 B2 | 3/2006 | Challoner et al. |
| 7,040,163 B2 | 5/2006 | Shcheglov et al. |
| 7,043,985 B2 | 5/2006 | Ayazi et al. |
| 7,056,757 B2 | 6/2006 | Ayazi et al. |
| 7,093,486 B2 | 8/2006 | Challoner et al. |
| 7,100,448 B2 | 9/2006 | Ikegami |
| 7,104,129 B2 | 9/2006 | Nasiri et al. |
| 7,138,694 B2 | 11/2006 | Nunan et al. |
| 7,159,441 B2 | 1/2007 | Challoner et al. |
| 7,168,317 B2 | 1/2007 | Chen et al. |
| 7,168,318 B2 | 1/2007 | Challoner et al. |
| 7,176,556 B2 | 2/2007 | Okamoto et al. |
| 7,180,019 B1 | 2/2007 | Chiou et al. |
| 7,210,351 B2 | 5/2007 | Lo et al. |
| 7,217,588 B2 | 5/2007 | Hartzell et al. |
| 7,238,999 B2 | 7/2007 | LaFond et al. |
| 7,247,246 B2 | 7/2007 | Nasiri et al. |
| 7,250,112 B2 | 7/2007 | Nasiri et al. |
| 7,250,353 B2 | 7/2007 | Nasiri et al. |
| 7,258,008 B2 | 8/2007 | Durante et al. |
| 7,258,011 B2 | 8/2007 | Nasiri et al. |
| 7,258,012 B2 | 8/2007 | Xie |
| 7,275,424 B2 | 10/2007 | Felton et al. |
| 7,291,561 B2 | 11/2007 | Ma et al. |
| 7,318,349 B2 | 1/2008 | Vaganov et al. |
| 7,322,236 B2 | 1/2008 | Combi et al. |
| 7,337,671 B2 | 3/2008 | Ayazi et al. |
| 7,347,095 B2 | 3/2008 | Shcheglov et al. |
| 7,360,423 B2 | 4/2008 | Ayazi et al. |
| 7,417,329 B2 | 8/2008 | Chuang et al. |
| 7,442,570 B2 | 10/2008 | Nasiri et al. |
| 7,458,263 B2 | 12/2008 | Nasiri et al. |
| 7,484,410 B2 | 2/2009 | Tsuji et al. |
| 7,491,567 B2 | 2/2009 | DCamp et al. |
| 7,518,493 B2 | 4/2009 | Bryzek et al. |
| 7,543,496 B2 | 6/2009 | Ayazi et al. |
| 7,578,189 B1 | 8/2009 | Mehregany |
| 7,615,406 B2 | 11/2009 | Higashi et al. |
| 7,621,183 B2 | 11/2009 | Seeger et al. |
| 7,624,494 B2 | 12/2009 | Challoner et al. |
| 7,642,115 B2 | 1/2010 | Eriksen et al. |
| 7,642,657 B2 | 1/2010 | Suilleabhain et al. |
| 7,677,099 B2 | 3/2010 | Nasiri et al. |
| 7,684,101 B2 | 3/2010 | Border et al. |
| 7,694,563 B2 | 4/2010 | Durante et al. |
| 7,748,272 B2 | 7/2010 | Kranz et al. |
| 7,755,367 B2 | 7/2010 | Schoen et al. |
| 7,767,483 B1 | 8/2010 | Waters |
| 7,784,344 B2 | 8/2010 | Pavelescu et al. |
| 7,786,572 B2 | 8/2010 | Chen |
| 7,851,898 B2 | 12/2010 | Nakamura et al. |
| 7,863,698 B2 | 1/2011 | Seeger et al. |
| 7,875,942 B2 | 1/2011 | Cortese et al. |
| 7,882,740 B2 | 2/2011 | Okada |
| 7,886,601 B2 | 2/2011 | Merassi et al. |
| 7,898,043 B2 | 3/2011 | Ziglioli et al. |
| 7,908,921 B2 | 3/2011 | Binda et al. |
| 7,928,632 B2 | 4/2011 | Yang et al. |
| 7,934,423 B2 | 5/2011 | Nasiri et al. |
| 7,964,428 B2 | 6/2011 | Breng et al. |
| 7,982,291 B2 | 7/2011 | Kuisma |
| 8,042,394 B2 | 10/2011 | Coronato et al. |
| 8,047,075 B2 | 11/2011 | Nasiri et al. |
| 8,049,515 B2 | 11/2011 | Schoen et al. |
| 8,069,726 B2 | 12/2011 | Seeger et al. |

(56) References Cited

U.S. PATENT DOCUMENTS

| | | | |
|---|---|---|---|
| 8,071,398 B1 | 12/2011 | Yang et al. |
| 8,077,372 B2 | 12/2011 | Border et al. |
| 8,080,869 B2 | 12/2011 | Okudo et al. |
| 8,084,332 B2 | 12/2011 | Nasiri et al. |
| 8,100,012 B2 | 1/2012 | Martin et al. |
| 8,124,895 B2 | 2/2012 | Merassi et al. |
| 8,134,214 B2 | 3/2012 | Baldo et al. |
| 8,151,640 B1 | 4/2012 | Kubena |
| 8,176,782 B2 | 5/2012 | Furukubo et al. |
| 8,227,285 B1 | 7/2012 | Yang et al. |
| 8,227,911 B1 | 7/2012 | Yang et al. |
| 8,236,577 B1 | 8/2012 | Hsu et al. |
| 8,258,590 B2 | 9/2012 | Geiger et al. |
| 8,272,266 B2 | 9/2012 | Zhang et al. |
| 8,283,737 B2 | 10/2012 | Sugizaki |
| 8,289,092 B2 | 10/2012 | Pomarico et al. |
| 8,314,483 B2 | 11/2012 | Lin et al. |
| 8,324,047 B1 | 12/2012 | Yang |
| 8,347,717 B2 | 1/2013 | Seeger et al. |
| 8,350,346 B1 | 1/2013 | Huang et al. |
| 8,365,595 B2 | 2/2013 | Geiger et al. |
| 8,372,677 B2 | 2/2013 | Mehregany |
| 8,375,789 B2 | 2/2013 | Prandi et al. |
| 8,384,134 B2 | 2/2013 | Daneman et al. |
| 8,395,252 B1 | 3/2013 | Yang |
| 8,395,381 B2 | 3/2013 | Lo et al. |
| 8,402,666 B1 | 3/2013 | Hsu et al. |
| 8,405,170 B2 | 3/2013 | Kohl et al. |
| 8,407,905 B1 | 4/2013 | Hsu et al. |
| 8,413,506 B2 | 4/2013 | Coronato et al. |
| 8,421,082 B1 | 4/2013 | Yang |
| 8,426,961 B2 | 4/2013 | Shih et al. |
| 8,432,005 B2 | 4/2013 | Yang et al. |
| 8,433,084 B2 | 4/2013 | Conti et al. |
| 8,459,093 B2 | 6/2013 | Donadel et al. |
| 8,459,110 B2 | 6/2013 | Cazzaniga et al. |
| 8,461,935 B2 | 6/2013 | McCraith et al. |
| 8,481,365 B2 | 7/2013 | Verhelijden et al. |
| 8,487,444 B2 | 7/2013 | Law et al. |
| 8,490,461 B2 | 7/2013 | Sasaki et al. |
| 8,508,039 B1 | 8/2013 | Nasiri et al. |
| 8,508,045 B2 | 8/2013 | Khan et al. |
| 8,513,747 B1 | 8/2013 | Huang et al. |
| 8,519,537 B2 | 8/2013 | Jeng |
| 8,567,246 B2 | 10/2013 | Shaeffer et al. |
| 8,569,090 B2 | 10/2013 | Taheri |
| 8,587,077 B2 | 11/2013 | Chen |
| 8,593,036 B2 | 11/2013 | Boysel |
| 8,637,943 B1 | 1/2014 | Yang |
| 8,652,961 B1 | 2/2014 | Yang |
| 8,685,776 B2 | 4/2014 | LaFond et al. |
| 8,704,238 B2 | 4/2014 | Yang et al. |
| 8,869,616 B1 | 10/2014 | Sridharamurthy et al. |
| 8,885,170 B2 | 11/2014 | Kilic et al. |
| 8,921,145 B2 | 12/2014 | Shu et al. |
| 9,046,541 B1 | 6/2015 | Kubena et al. |
| 9,309,106 B2 | 4/2016 | Boysel et al. |
| 2001/0011994 A1 | 8/2001 | Morimoto et al. |
| 2002/0040602 A1 | 4/2002 | Okada |
| 2003/0094046 A1 | 5/2003 | Okada |
| 2003/0209075 A1 | 11/2003 | Okada |
| 2004/0052016 A1 | 3/2004 | Takagi et al. |
| 2004/0231422 A1 | 11/2004 | Okada |
| 2005/0210981 A1 | 9/2005 | Okada |
| 2006/0163453 A1 | 7/2006 | Hynes et al. |
| 2006/0179941 A1 | 8/2006 | Okada |
| 2006/0180896 A1 | 8/2006 | Martin et al. |
| 2006/0185428 A1 | 8/2006 | Combi et al. |
| 2007/0279885 A1 | 12/2007 | Basavanhally et al. |
| 2008/0289417 A1 | 11/2008 | Okada |
| 2009/0114016 A1 | 5/2009 | Nasiri et al. |
| 2009/0199637 A1* | 8/2009 | Sugiura ............ G01P 15/0802 73/514.32 |
| 2010/0132460 A1 | 6/2010 | Seeger et al. |
| 2010/0176466 A1 | 7/2010 | Fujii et al. |
| 2011/0219876 A1 | 9/2011 | Kalnitsky et al. |
| 2012/0048017 A1 | 3/2012 | Kempe |
| 2012/0091854 A1 | 4/2012 | Kaajakari |
| 2012/0137774 A1 | 6/2012 | Judy et al. |
| 2012/0142144 A1* | 6/2012 | Taheri ............ B81B 7/007 438/107 |
| 2012/0227487 A1 | 9/2012 | Ayazi et al. |
| 2012/0326248 A1 | 12/2012 | Daneman et al. |
| 2013/0019680 A1 | 1/2013 | Kittilsland et al. |
| 2013/0105921 A1 | 5/2013 | Najafi et al. |
| 2013/0115729 A1 | 5/2013 | Silverbrook et al. |
| 2013/0119492 A1 | 5/2013 | Feiertag et al. |
| 2013/0126992 A1 | 5/2013 | Ehrenpfordt et al. |
| 2013/0146994 A1 | 6/2013 | Kittilsland et al. |
| 2013/0147020 A1 | 6/2013 | Gonska et al. |
| 2013/0168740 A1 | 7/2013 | Chen |
| 2013/0181355 A1 | 7/2013 | Tsai et al. |
| 2013/0221454 A1 | 8/2013 | Dunbar, III et al. |
| 2013/0341737 A1 | 12/2013 | Bryzek et al. |
| 2014/0090485 A1 | 4/2014 | Feyh et al. |
| 2014/0116135 A1 | 5/2014 | Cazzaniga et al. |
| 2014/0116136 A1 | 5/2014 | Coronato et al. |
| 2014/0124958 A1 | 5/2014 | Bowles et al. |
| 2014/0137648 A1 | 5/2014 | Zolfagharkhani et al. |
| 2014/0138853 A1 | 5/2014 | Liu et al. |
| 2014/0162393 A1 | 6/2014 | Yang |
| 2014/0166463 A1 | 6/2014 | Jahnes et al. |
| 2014/0183729 A1 | 7/2014 | Bowles |
| 2014/0186986 A1 | 7/2014 | Shu et al. |
| 2014/0193949 A1 | 7/2014 | Wu |
| 2014/0203421 A1 | 7/2014 | Shu et al. |
| 2014/0210019 A1 | 7/2014 | Nasiri et al. |
| 2014/0227816 A1 | 8/2014 | Zhang et al. |
| 2014/0230548 A1 | 8/2014 | Coronato et al. |
| 2014/0231936 A1 | 8/2014 | Jahnes et al. |
| 2014/0231938 A1 | 8/2014 | Campedelli et al. |
| 2014/0283605 A1 | 9/2014 | Baldasarre et al. |
| 2014/0287548 A1 | 9/2014 | Lin et al. |
| 2014/0291128 A1 | 10/2014 | Kwa |
| 2014/0311242 A1 | 10/2014 | Lee et al. |
| 2014/0311247 A1 | 10/2014 | Zhang et al. |
| 2014/0318906 A1 | 10/2014 | Deimerly et al. |
| 2014/0319630 A1 | 10/2014 | Conti et al. |
| 2014/0322854 A1 | 10/2014 | Nakatani et al. |
| 2014/0326070 A1 | 11/2014 | Neul et al. |
| 2014/0331769 A1 | 11/2014 | Fell |
| 2014/0339654 A1 | 11/2014 | Classen |
| 2014/0339656 A1 | 11/2014 | Schlarmann et al. |
| 2014/0349434 A1 | 11/2014 | Huang et al. |
| 2014/0352433 A1 | 12/2014 | Hammer |
| 2014/0353775 A1 | 12/2014 | Formosa et al. |
| 2014/0357007 A1 | 12/2014 | Cheng et al. |
| 2014/0370638 A1 | 12/2014 | Lee et al. |
| 2014/0374854 A1 | 12/2014 | Xue |
| 2014/0374917 A1 | 12/2014 | Weber et al. |
| 2014/0374918 A1 | 12/2014 | Weber et al. |
| 2015/0008545 A1 | 1/2015 | Quevy et al. |
| 2015/0115376 A1 | 4/2015 | Chen et al. |
| 2015/0191345 A1 | 7/2015 | Boysel et al. |
| 2015/0260519 A1 | 9/2015 | Boysel et al. |
| 2016/0229684 A1 | 8/2016 | Boysel |
| 2016/0229685 A1 | 8/2016 | Boysel |
| 2017/0030788 A1 | 2/2017 | Boysel et al. |
| 2017/0108336 A1 | 4/2017 | Boysel et al. |

FOREIGN PATENT DOCUMENTS

| | | |
|---|---|---|
| JP | 2008-114354 A | 5/2008 |
| JP | 2013-164285 A | 8/2013 |
| WO | 2008086530 A2 | 7/2008 |
| WO | 2009057990 A2 | 5/2009 |
| WO | 2013116356 A1 | 8/2013 |
| WO | 2014122910 A1 | 8/2014 |
| WO | 2014159957 A1 | 10/2014 |
| WO | 2014177542 A1 | 11/2014 |
| WO | 2014184025 A1 | 11/2014 |
| WO | 2015003264 A1 | 1/2015 |
| WO | 2015013827 A1 | 2/2015 |
| WO | 2015013828 A1 | 2/2015 |

(56) References Cited

FOREIGN PATENT DOCUMENTS

| WO | 2015042700 A1 | 4/2015 |
| WO | 2015042701 A1 | 4/2015 |
| WO | 2015042702 A1 | 4/2015 |
| WO | 2015103688 A1 | 7/2015 |
| WO | 2015154173 A1 | 10/2015 |

OTHER PUBLICATIONS

Boysel et al., Development of a Single-Mass Five-Axis MEMS Motion Sensor. Virtus Advanced Sensors, Inc., 17 pages. (May 2009).
Boysel, White Paper Series: Virtus Sensor Technology. Virtus Advanced Sensors. Semicon Japan, 11 pages. Nov. 11, 2008.
Watanabe et al., SOI micromachined 5-axis motion sensor using resonant electrostatic drive and non-resonant capacitive detection mode. Sensor and Actuators A. 2006;130-131:116-123.
European Search Report for Application No. 14822259.9 dated Jan. 4, 2017.
International Search Report and Written Opinion for International Patent Application No. PCT/CA2014/050729, dated Nov. 3, 2014.
International Search Report and Written Opinion for International Patent Application No. PCT/CA2014/050902, dated Dec. 15, 2014.
International Search Report and Written Opinion for International Patent Application No. PCT/CA2014/050904, dated Dec. 1, 2014.
International Search Report and Written Opinion for International Patent Application No. PCT/CA2014/050910, dated Dec. 22, 2014.
International Search Report and Written Opinion for International Patent Application No. PCT/CA2014/051245, dated Feb. 25, 2015.
International Search Report and Written Opinion for International Patent Application No. PCT/CA2015/050018, dated Apr. 20, 2015.
International Search Report and Written Opinion for International Patent Application No. PCT/CA2015/050026, dated Apr. 27, 2015.

* cited by examiner

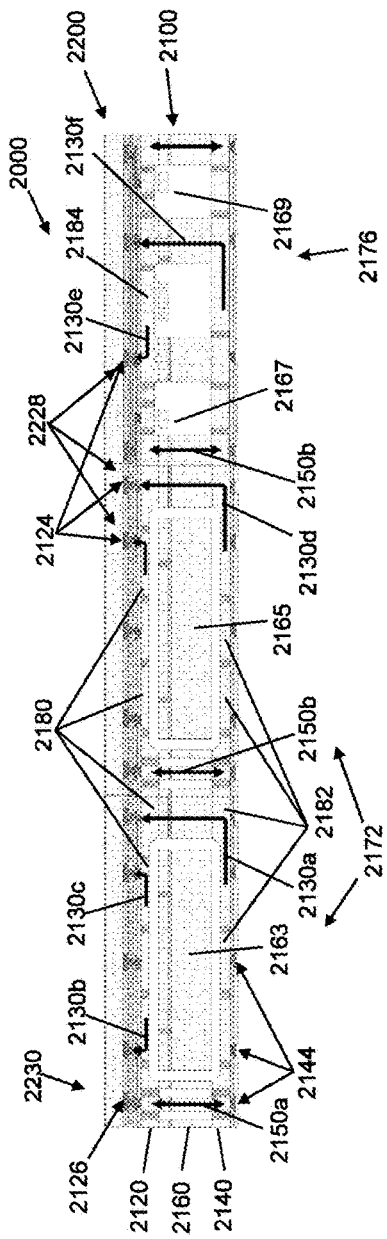
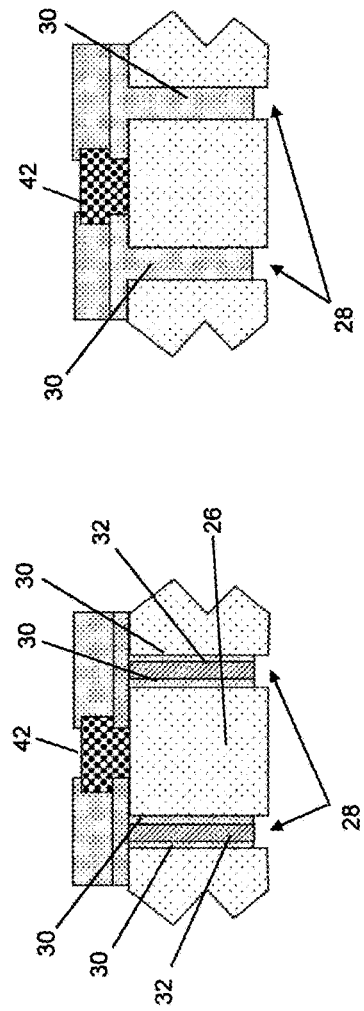
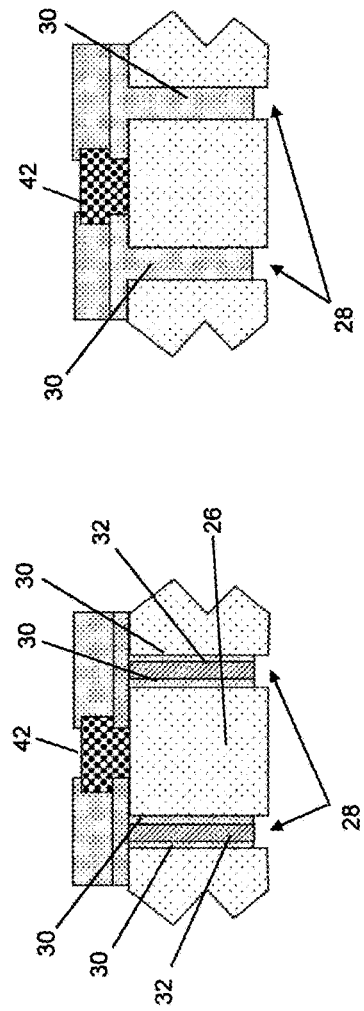
Figure 2A
Figure 2B
Figure 2C

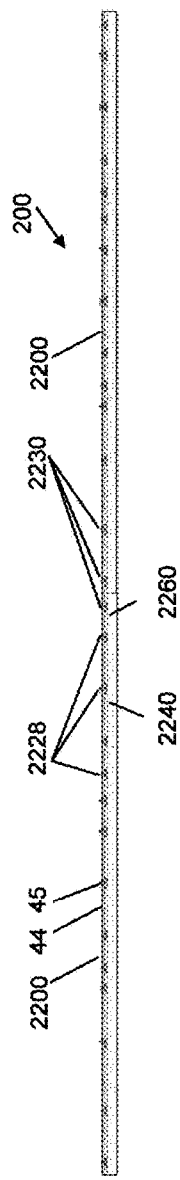
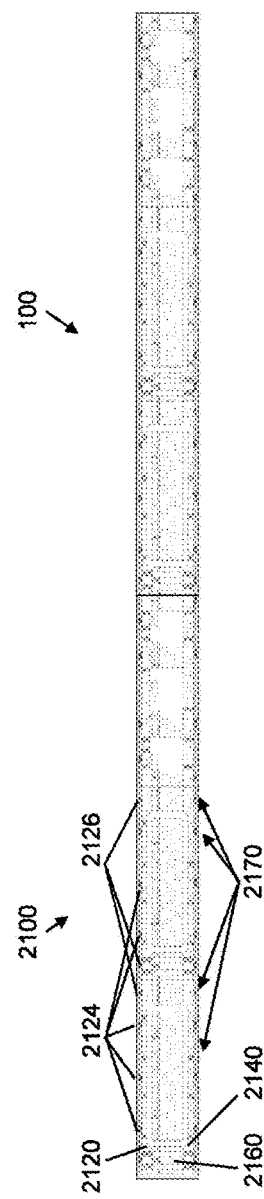
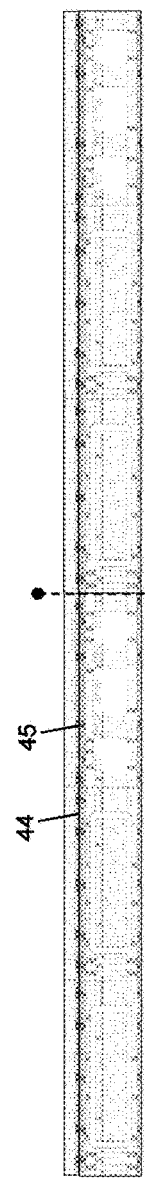
Figure 2D
Figure 2E
Figure 2F

INTEGRATED MEMS SYSTEM

CROSS-REFERENCE TO RELATED APPLICATIONS

This application is a continuation-in-part of International Application PCT/CA2014/051245 filed Dec. 22, 2014, which claims priority to U.S. Provisional Application No. 61/925,379 filed Jan. 9, 2014, the entire contents of the above applications being incorporated herein by reference.

BACKGROUND OF THE INVENTION

This invention relates to the integration of microelectromechanical systems (MEMS) devices, such as sensors and actuators, and more particularly to an integrated MEMS system including integrated circuits (IC) and MEMS chips.

Micro-electro-mechanical system (MEMS) devices, in particular inertial sensors such as accelerometers and angular rate sensors or gyroscopes, are being used in a steadily growing number of applications. Due to the significant increase in consumer electronics applications for MEMS sensors such as optical image stabilization (OIS) for cameras embedded in smart phones and tablet PCs, virtual reality systems and wearable electronics, there has been a growing interest in utilizing such technology for more advanced applications which have been traditionally catered to by much larger, more expensive and higher grade non-MEMS sensors. Such applications include single- and multiple-axis devices for industrial applications, inertial measurement units (IMUs) for navigation systems and attitude heading reference systems (AHRS), control systems for unmanned air, ground and sea vehicles and for personal indoor GPS-denied navigation. These applications also may include healthcare/medical and sports performance monitoring and advanced motion capture systems for next generation virtual reality. These advanced applications often require lower bias stability and higher sensitivity specifications well beyond the capability of existing consumer-grade MEMS inertial sensors on the market. In order to expand these markets and to create new ones, it is desirable and necessary that higher performance specifications be developed. It is also necessary to produce a low cost and small size sensor and/or MEMS inertial sensor-enabled system(s).

Given that MEMS inertial sensors such as accelerometers and gyroscopes are typically much smaller than traditional mechanical gyroscopes, they tend to be subject to higher mechanical noise and drift. Also, since position and attitude are calculated by integrating the acceleration and angular rate data, respectively, noise and drift lead to growing errors. Consequently, for applications requiring high accuracy, such as navigation, it is generally desirable to augment the six-degree-of-freedom (6DOF) inertial capability of MEMS motion sensors (i.e., three axes of acceleration and three axes of angular rotation) with other position- and/or orientation-dependent measurements. Such sensor fusion is necessary for better results.

The success of the semiconductor industry has been driven by the ever-increasing density of devices on silicon integrated circuits. Historically, this increase in density has been accomplished by the reduction of electronic device feature sizes, through improved methods of photolithography and etching. Integrated circuit (IC) feature sizes have reached submicron dimensions with 180 nm being common, and 10-20 nm as the state of the art. These dimensions are approaching the limits of conventional semiconductor processes, particularly photolithographic optical limits. At the same time, overall chip functionality has been increased by expanding the lateral chip dimensions in 2D to create ever larger chips.

In practice, the electrical traces on the package substrates are much larger than those on the silicon chips. This mismatch leads to routing difficulties and excessive power consumption, and has led to the introduction of silicon (Si) interposers upon which fine signal distribution traces can be patterned on the chip side and coarse connections patterned on the substrate side with electrical interconnections between the two through the interposer. This approach using a Si interposer is referred to as 2.5D, since the chips are distributed in 2D, but the interposer has been introduced in the third dimension albeit with little additional functionality other than passive elements such as resistors and capacitors.

The development of through-silicon vias (TSVs) has enabled 3D integrated circuits (3DIC) in which the individual IC chips are thinned and stacked. The introduction of TSV technology to the IC process adds an additional level of complexity. IC processes are typically constrained to a few microns near the surface of the IC chip and require fine feature photolithography while the TSV processes are coarser features and penetrate the thickness of the IC. Thus, regions of the IC chip must be segregated for TSV fabrication, resulting in inefficient use of the silicon area and higher IC unit cost. Furthermore, the TSVs are typically metal-filled, particularly with copper. The copper cannot be part of the front-end process because of the temperatures needed to fabricate the IC circuits. Thus TSVs must be made of polysilicon if they are to be fabricated early in the process, or they must be fabricated at the end of the process if they are to be made of metal. Either approach adds complexity to a semiconductor process that is typically highly controlled and not amenable to modification.

In parallel with the efforts to integrate more and more electrical function into 3DICs, there is a desire to integrate MEMS into electronics. MEMS are integrated circuits containing tiny mechanical, optical, magnetic, electrical, chemical, biological, or other, transducers or actuators. As electronic devices include more and more features, designers need to include MEMS sensors to provide feedback for the user. For example, smart phones are incorporating MEMS accelerometers and gyroscopes to provide motion information for phone position, gesture-based instructions, navigation and games. As electronics become smaller, more complex, and more integrated, it is desirable to include MEMS devices in system chips, which include integrated circuits to process the MEMS signals. However, there are some fundamental differences between many MEMS fabrication processes and IC fabrication processes. For most MEMS devices, the MEMS mechanical element (e.g. proof mass, micro-mirror, micro-pump, pressure-sensitive membrane) needs to be free to move. Consequently, fabrication processes must be added to free the MEMS mechanical element. Additionally, since MEMS transducers are by design sensitive to some environmental influences, MEMS packaging must protect the transducer from undesired environmental influences. This results in packages that are more complex than those used in standard IC packaging.

There have been efforts to integrate the MEMS transducer with its sense electronics IC over the years. These have included packaging the MEMS and IC side by side, fabricating the MEMS directly on the IC, and stacking the MEMS and IC. The drawback to these approaches is that in general they require additional final packaging including a cap to protect the MEMS and wire bonds to make electrical connection to the IC. This chip-scale packaging adds considerable expense to the final device. The cap over the MEMS also makes chip stacking for 3DIC applications difficult, if not impossible.

An integrated motion processing unit has been proposed, however, the costs of individual chip packaging, board fabrication, chip mounting, and mechanical alignment make such approaches costly and useful mainly for high margin applications such as navigation.

Cost and size can be reduced by bringing more and more MEMS functions onto fewer MEMS chips and integrating more electrical functions into fewer IC's, and it is desirable to integrate all the MEMS sensors and electronics onto a single substrate. Typically, existing "single chip" inertial measurement units (IMUs) consist of bare chips that are adhesively attached and wire bonded together to a package substrate that is covered with a cap or plastic molding. Thus, beyond the system components within the chip, no further 3D integration is possible.

BRIEF SUMMARY OF THE INVENTION

The present invention provides a three-dimensional (3D) MEMS architecture that enables the integration of MEMS devices with IC chips to form a MEMS-enabled system chip ("3DS"). According to an aspect of the invention, an integrated MEMS system is provided. In a possible embodiment, the integrated MEMS system comprises at least one single MEMS chip, and at least one IC chip.

A MEMS chip comprises a first cap layer with first and second sets of first cap MEMS-electrical contacts. The MEMS also comprises a second cap layer with second cap MEMS-electrical contacts. The first and second cap MEMS-electrical contacts are preferably bond pads. A central MEMS layer is located between the first and second cap layers. At least one transducer is formed in the first cap layer, the central MEMS layer and the second cap layer, for producing motion or sensing at least one parameter. First insulated conducting pathways are respectively connecting the one or more transducer(s) to the first set of first cap MEMS-electrical contacts, for conducting electrical MEMS signals between the transducer(s) and the first cap MEMS-electrical contacts of the first set. Second insulated conducting pathways are connecting the second set of first cap MEMS-electrical contacts to at least some of the second cap MEMS-electrical contacts, through the first cap layer, the central MEMS layer, and the second cap layer, for conducting auxiliary signals through the MEMS chip.

A single IC chip comprises first and second sets of IC-electrical contacts respectively bump bonded to the first and second sets of first cap MEMS-electrical contacts. The single IC chip comprises MEMS signal processing circuitry, operatively connected to first set of IC-electrical contacts, for processing the electrical MEMS signals; and auxiliary signal processing circuitry, operatively connected to the second set of IC-electrical contacts, for processing the auxiliary signals and for providing additional system functions.

The first cap layer, the central MEMS layer and the second cap layer are preferably made of an electrically conducting material, the first cap layer being electrically bonded to a first side of the central MEMS layer, and the second cap layer being electrically bonded to a second side of the central MEMS layer, opposite the first side. More particularly, the first cap layer, the central MEMS layer and the second cap layer are preferably fabricated from respective silicon-based wafers bonded at wafer level.

In some embodiments, the central MEMS layer is made from a silicon-on-insulator wafer. The central MEMS layer can have a moveable mass in a range or subrange of 0.1-15 milligrams. For applications in which small size is more critical, masses in the 0.5-1.5 milligram range are used, such as for certain industrial and consumer electronics components. For high performance navigational and other applications where larger masses are more critical, masses in a range of 3-6 milligrams can be used. For mid range performance, masses in a range of 1.5-3 milligrams can be used.

In some embodiments, the second insulated conducting pathways are formed by trenches etched in one of the first layer, the central MEMS layer and the second layer. The trenches are aligned and filled with an insulating material. The trenches surround respective conductive wafer plugs, the conductive wafer plugs allowing transmission of electrical signals though the entire thickness of the MEMS chip.

In some embodiments, at least some of the second insulated conducting pathways are formed by trenches etched in one of the first layer, the central MEMS layer and the second layer. The trenches are aligned and have their respective sidewalls lined with an insulating material and filled with a conductive material.

In some embodiments, the transducers comprise a six-degree-of-freedom motion sensor, and the parameters comprise three-axes of linear acceleration and three axes of angular rate.

In some embodiments, the six-degree-of-freedom motion sensor comprises first and second sets of electrodes respectively provided in the first and second cap layers, and a plurality of proof masses provided in the central MEMS layer. The first and second sets of electrodes form capacitors with the proof masses, and some of the first insulated conducting pathways respectively connect the electrodes of the first and second sets of electrodes to at least some of the first cap MEMS-electrical contacts of the first set of MEMS-electrical contacts.

In some embodiments, the at least one transducer comprises at least one non-inertial sensor, such as a pressure sensor, a magnetometer, a thermometer, and a microphone. The non-inertial sensor typically comprises non-inertial electrodes patterned in the first or second layer, and at least one MEMS structure patterned in the central MEMS layer. Some of the first insulated conducting pathways connect the non-inertial electrodes to at least some of the first cap MEMS-electrical contacts of the first set.

The electrical MEMS signals are in most cases analog signals, and the IC chip comprises mixed-signal CMOS circuitry to convert analog signals transmitted by the MEMS chip into digital signals for processing by the MEMS signal processing circuitry, and to convert digital signals transmitted by the MEMS signal processing circuitry into analog signals before entering the MEMS chip.

In some embodiments, the IC chip comprises a digital bus, and the MEMS signal processing circuitry comprises digital CMOS circuitry connected to said mixed-signal circuitry via the digital bus. The digital CMOS circuitry may comprise at least one of: a digital data analysis circuitry, a digital input/output circuitry, a memory, a system controller and a calibration/compensation circuitry.

In some embodiments, the IC chip comprises a power bus and the auxiliary signal processing circuitry comprises power management circuitry connected to the power bus and to the digital bus. The IC chip may also comprise high speed CMOS circuitry connected to the digital bus, for processing the auxiliary signals. The high speed CMOS circuitry may include an input-output module for wireless or GPS signals.

In some embodiments, the integrated MEMS system comprises a first single MEMS chip and at least one additional single MEMS chip. The first single MEMS chip and the at one additional single MEMS chip are stacked vertically, or one above the other, the second layer of the first single MEMS chip being bump bonded to the first layer of said at least one additional single MEMS chip.

The second insulated conducting pathways of the at least one additional single MEMS chip is electrically connected to at least some of the second insulated conducting pathways of the first single MEMS chip, for conducting auxiliary signals through the first and said at least one additional single MEMS chip, to the at least one IC chip.

Preferably, the first MEMS chip includes a third set of first cap MEMS-electrical contacts and third insulated conducting pathways connecting the first cap MEMS-electrical contacts of the third set to at least some of the second cap MEMS-electrical contacts, through the first cap layer, the central MEMS layer and the second cap layer. The third insulated conducting pathways are electrically connected to the MEMS signal processing circuitry of the IC chip, and is electrically connected to insulated conducting pathways of the at least one additional single MEMS chip. The MEMS signal processing circuitry can thus process the electrical MEMS signals of the first and of the additional single MEMS chips.

In some embodiments, it is also useful that the integrated MEMS system comprises a first single IC chip and at least one additional single IC chip. The additional IC chip(s) can be mounted on a common circuit board or stacked vertically as described herein.

Of course, other processing steps may be performed prior, during or after the above described steps. The order of the steps may also differ, and some of the steps may be combined.

BRIEF DESCRIPTION OF THE DRAWINGS

It should be noted that the drawings illustrate only exemplary embodiments of the invention and are, therefore, not to be considered limiting of its scope, for the invention may admit to other equally effective embodiments.

FIG. 2A is a schematic, cross-sectional view of an integrated MEMS system, according to another embodiment. FIGS. 2B and 2C are detail views of insulated conducting pathways formed in the MEMS chip, showing two possible variants. FIG. 2D is a schematic, cross-sectional view of an integrated circuit wafer. FIG. 2E is a schematic, cross-sectional view of a MEMS wafer stack. FIG. 2F is a schematic, cross-sectional view showing wafer-level flip bonding of the integrated circuit wafer of FIG. 2D to the MEMS wafer stack of FIG. 2E.

DETAILED DESCRIPTION OF THE INVENTION

Figure 1A:
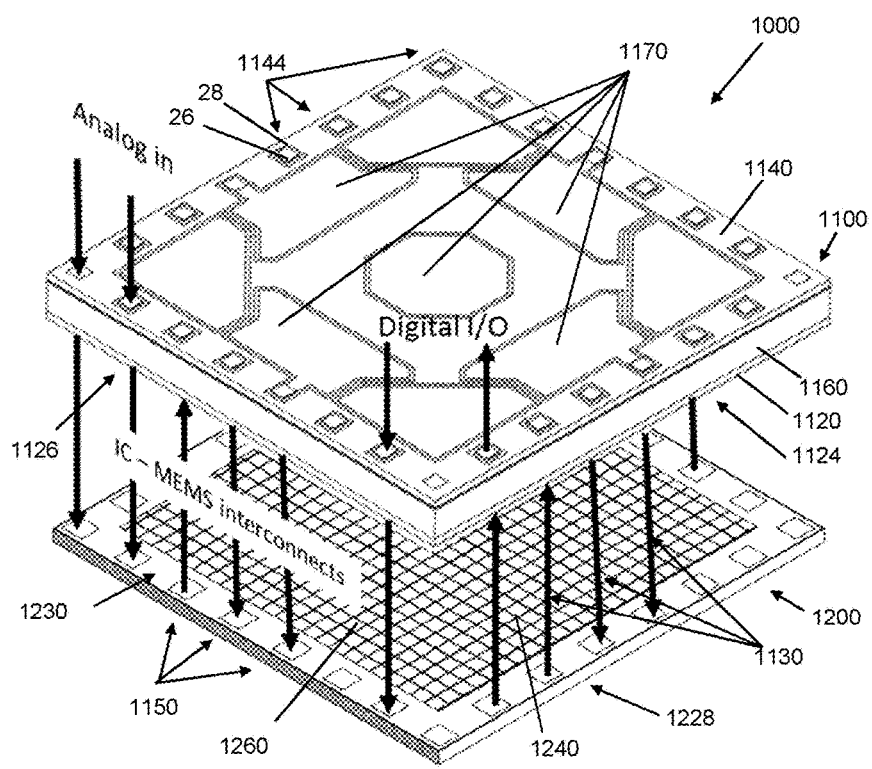
FIG. 1A is a schematic, partially exploded perspective view of an integrated MEMS system, according to an embodiment.

In the following description, similar features in the drawings have been given similar reference numerals and, in order to preserve clarity in the drawings, some reference numerals may be omitted when they were already identified in a preceding figure. It should also be understood that the elements of the drawings are not necessarily depicted to scale, since emphasis is placed upon clearly illustrating the elements and structures of the present embodiments.

Throughout the present description, terms such as "top" and "bottom", "above" and "below", "over" and "under", "upper" and "lower", and other like terms indicating the position of one element with respect to another element are used herein for ease and clarity of description, as illustrated in the figures, and should not be considered limitative. It will be understood that such spatially relative terms are intended to encompass different orientations of the MEMS chips in use or operation, in addition to the orientation exemplified in the figures. In particular, the terms "top" and "bottom" are used to facilitate reading of the description, and those skilled in the art of MEMS will readily recognize that, when in use, MEMS sensors can be placed in different orientations such that the "top cap" and the "bottom cap" are positioned upside down.

In addition, the term MEMS transducers encompasses devices such as, but not limited to, accelerometers, gyroscopes, pressure sensors, magnetometers, actuators, microfluidic devices, micro-optic devices and the likes. An IC chip may also include microelectronic circuits such as power amplifiers, detection circuitry, GPS, microprocessors, and the like. The "MEMS portion" of the integrated MEMS systems described herein can also be referred to as a multi-wafer stack 3DS MEMS.

A MEMS system is generally a mixed-signal (analog and digital) system. A MEMS chip is typically analog, comprising a continuously variable transducer (sensor or actuator), whereas the data acquired or provided to drive the MEMS is almost always used or produced digitally. A MEMS chip can have one or more analog input/output (I/O) channels and the electronic system can include both analog and digital outputs. The analog MEMS channels can be used for transmitting the MEMS sensor outputs to the digital system and for providing analog signals to the MEMS for actuation or sensor operation. Typically, the MEMS can interface with an analog-to-digital converter (ADC) which can amplify and convert the MEMS sensor output to digital form, and/or convert a digital signal into an analog voltage or current that can be used to operate the MEMS. Beyond this interface most of the data handling can be digital.

Broadly described, the present invention is directed to an integrated MEMS system. The integrated MEMS system is fabricated from a multi-wafer MEMS stack including first and second cap wafers and a central MEMS wafer, which can be a standard wafer, silicon-on-insulator (SOI) wafer or multiple wafers. The multi-wafer stack is comprised of insulated conducting pathways, which can also be referred to as 3D Through-Chip-Vias ("3DTCV"). These insulated conducting pathways are formed by patterning trenches in the silicon wafers around plugs of silicon. The trenches are filled or lined with an insulating material in order to isolate the silicon plugs. The silicon plugs of the first, central MEMS and second wafer are aligned to form insulated conducting pathways, some extending through the entire thickness of the multi-wafer stack. The insulated conducting pathways allow communicating signals from bond pads on the first cap layer and from electrodes on the first, second and/or central MEMS wafers, through the central MEMS wafer, to and through the second cap wafer to bond pads on the second cap wafer. An IC wafer is bump-bonded to the first or second cap wafer of the multi-wafer stack, and diced for forming singulated or individual integrated MEMS systems. This arrangement provides electrical routing between the multi-wafer MEMS stack and the integrated circuit, since the integrated circuit I/O pads are bump bonded to the pads of one of the first and second caps. After dicing, the individual components are integrated MEMS systems which can in turn be bump bonded to a PCB, eliminating the need for bond wires and external packaging.

Figure 1B:
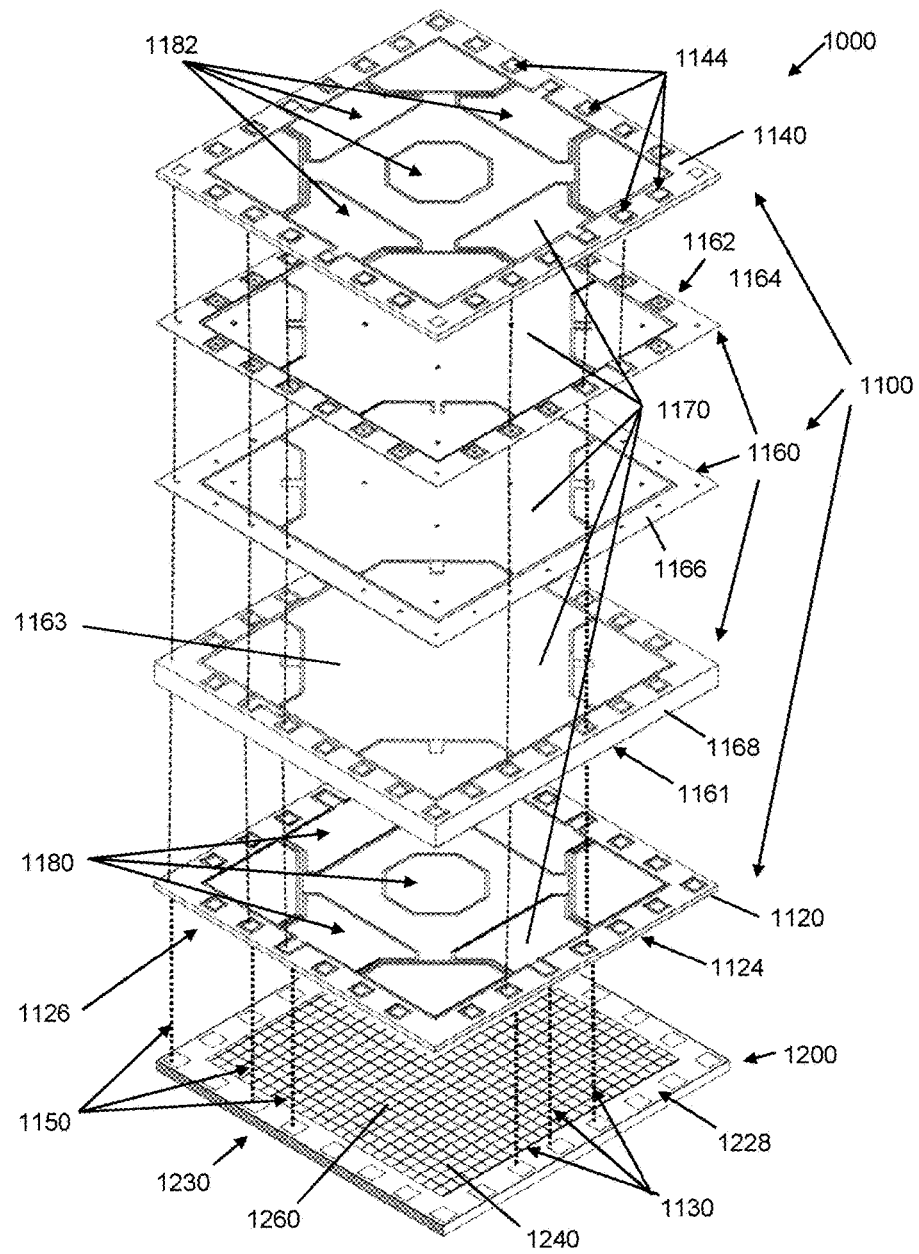
FIG. 1B is a schematic, exploded perspective view of the integrated MEMS system of FIG. 1A.

Referring to FIGS. 1A and 1B, a possible embodiment of an integrated MEMS system 1000 is shown. The system 1000 has an architecture that can enable MEMS sensor functions to be integrated into a single MEMS chip, while the electronic functions can be integrated into a single IC chip. This architecture allows passing auxiliary signals through the MEMS chip(s), to be processed by the IC chip. The MEMS chip, which includes a plurality of insulated conducting pathways, some extending through the entire thickness of the MEMS chip, enables wire-bond-free electrical connections to an IC chip. Auxiliary signals are non-MEMS signals, i.e. external to the MEMS chip, which are provided by another component, such as a PCB for example. The IC chip can be flip-chip bonded to the top of the MEMS chip, either at the chip or wafer level, forming an integrated MEMS system, eliminating much of the cost of MEMS and IC integration, as well as packaging complications and costs described earlier. The MEMS system can also include several single MEMS chip(s) stacked vertically, and also possibly more than one IC chip.

In this example, the integrated MEMS system 1000 comprises a single MEMS chip 1100, comprising a first cap layer 1120, a central MEMS layer 1160 and a second cap layer 1140. The layers 1120, 1160 and 1140 are made of an electrically conductive material, such as silicon. The first cap layer 1120 is electrically bonded to a first side 1161 of the central MEMS layer 1160, and the second cap layer 1140 is electrically bonded to a second side 1162 of the central MEMS layer 1160, opposite the first side 1161. The central MEMS layer 1160 is located between the first and second cap layers 1120, 1140, and is made of a silicon-on-insulator (SOI) wafer, including a device layer 1164, a handle layer 1168, and an insulating layer 1166. The first cap layer 1120, the central MEMS layer 1160 and the second cap layer 1140 are fabricated from respective silicon-based wafers, bonded at wafer level, as will be explained in more detail below. The insulating layer 1166 is a SOI buried oxide layer between the SOI device layer 1164 and SOI handle layer 1168. Conductive shunts are fabricated through the buried oxide layer 1166 to make an electrical connection between the SOI device and handle layers 1164, 1168 in specific desired places, for example as part of the insulated conducting pathways.

At least one transducer 1170 is formed in the first cap layer 1120, the central MEMS layer 1160 and the second cap layer 1140, for producing motion or sensing of at least one parameter. A transducer can be either a sensor, such as a motion sensor for example, or an actuator, such as a microswitch for example. The one or more transducer(s) include(s) MEMS structures, for example proof masses for motion sensors, or membranes for pressure sensors or magnetometers. The architecture of the MEMS chip 1100, with two outer caps and a central MEMS layers, interconnected and made of electrically conductive material, allows to include several different types of transducer within a single MEMS chip. The MEMS structures are patterned in the central MEMS layer 1160, and first and second sets of electrodes 1180, 1182 are patterned in the first and second layers 1120, 1140, and are operatively linked (such as magnetically, capacitively, electrically, etc.) to the MEMS structures. A "single MEMS chip" is thus a chip encapsulating one or more MEMS transducers patterned in the two cap layers 1120 and 1140 and central MEMS layer 1160. The different MEMS features (i.e. electrodes, proof masses, membranes, leads, etc.) of the transducer(s) are patterned within the same silicon wafer, in contrast with having multiple MEMS chips adhesively attached side-by-side on a substrate, with each chip including different MEMS sensors. For example, the present architecture allows to pattern MEMS features to measure acceleration, angular rate and magnetic field along three different axes, as well as other sensors, such as a pressure sensor, within the same three wafer layers, and thus within the same MEMS chip.

Still referring to FIGS. 1A and 1B, the first cap layer 1120 includes electrical contacts 1124, 1126 on its outer side, preferably located around the periphery of the MEMS chip 1100. These electrical contacts of the first cap layer 1124, 1126 are referred to as first cap MEMS-electrical contacts. The second cap layer 1140 also includes electrical contacts 1144 on its outer side, referred to as second cap MEMS-electrical contacts. The first and second cap MEMS-electrical contacts 1124, 1126 and 1144 are typically bond pads.

The single MEMS chip 1100 also includes a plurality of insulated conducting pathways 1130, 1150, extending through one or more of the first cap layer 1120, central MEMS layer 1160 and second layer 1140. The MEMS chip thus comprises electrically isolated "three dimensional through-chip vias" (3DTCVs) to transmit signals through the MEMS wafer layers 1160, to and through the cap layers 1120, 1140, to bond pads 1124, 1144 on the outer sides of the MEMS chip. The insulated conducting pathways 1130, 1150 can extend in one or more directions. The insulated conducting pathways 1130, 1150 can be formed using a silicon "trench-and-fill" process. The insulated conducting pathways 1130, 1150 are typically formed by insulated closed-looped trenches 28 surrounding conductive wafer plugs 26. The trenches 28 are filled with an insulating material and the conductive wafer plugs 26 allow the transmission of electrical signals. The insulated conducting pathways 1130, 1150 have portions extending in one or more layers, and are aligned at the layer interfaces, allowing the conducting of electrical signals through the MEMS chip 1100. Some of the insulated conducting pathways connect the one or more transducer to first cap MEMS-electrical contacts, part of a first set 1124 of contacts. These insulated conducting pathways are referred as first insulated conducting pathways 1130. They conduct electrical MEMS signals between the transducer(s) 1170 and the first cap MEMS-electrical contacts of said first set 1124. More specifically, insulated conducting pathways 1130 connect electrodes, leads and/or MEMS structures of the transducers 1170 to the first cap MEMS-electrical contacts 1124. Other insulated conducting pathways extend through the entire thickness of the single MEMS chip 1100, i.e. through the first cap layer 1120, through the central MEMS layer 1160 and through the second cap layer 1140. These insulated conducting pathways connect a second set of first cap MEMS-electrical contacts 1126 to some of the second cap MEMS-electrical contacts 1144. They are referred to as second insulated conducting pathways 1150, and serve to conduct auxiliary signals, such as power or digital signals, through the MEMS chip 1100. The second insulated conducting pathways 1150 provide an isolated pathway between the metallization and bond pads on the first cap layer 1120 and bond pads on the second cap layer 1140, to pass signals from an IC chip 1200, through the MEMS chip 1100, to another IC chip or to a PC board.

Still referring to FIGS. 1A and 1B, the integrated MEMS system 1000 also includes a single IC chip 1200. The IC chip 1200 is typically an application-specific integrated circuit (ASIC) chip, fabricated using complementary metal-oxide-semiconductor (CMOS) technology; but other types of ICs are possible. The IC chip 1200 includes MEMS signal processing circuitry 1240 operatively connected to the first insulated conducting pathways 1130, to process the electrical MEMS signals of the one or more transducers 1170. The IC chip 1200 also includes auxiliary signal processing circuitry 1260, operatively connected to the second insulated conducting pathways 1150, to process the auxiliary signals, and to provide additional system functions. The management functions performed by the IC can include interpretation of the sensor data, compensating for variations in sensor response due to temperature or other environmental variations, microcontroller management of system timing and functions, memory for storage of data such as calibration constants, sensor interpretation constants, and measured data, and wired and unwired data I/O.

The MEMS signal processing circuitry 1240 manages data signals to and from the MEMS transducer 1170. It controls and provides the analog drive and feedback signals required by the transducer; controls the timing of the signal measurements; amplifies, filters, and digitizes the measured signals; and analyses and interprets the incoming MEMS signals from the transducers 1170 to calculate different parameters, such as angular acceleration, or ambient pressure. The MEMS signal processing circuitry 1240 typically includes at least A/D and D/A converters, power, a system controller, a memory, a calibration and composition module, and a data analysis module.

The auxiliary signal processing circuitry 1260 processes signals other than those required strictly to operate the MEMS transducer and output the measured MEMS signals. It can also provide additional system functions, such as monitoring sensor activity to minimize power usage, transmit and receive data wirelessly, receive and interpret GPS signals, integrate additional data from other sensors or GPS for calibration or performance improvements, use the measured data to calculate additional system parameters of interest or to trigger other system activities. When fully utilized the auxiliary signal processing circuitry 1260 allows the integrated 3D system 1000 to control, perform, and analyze the measurements from the integrated MEMS sensor; act as a sensor hub between the 3DS system chip, other attached external sensors, and a larger external system such as a cell phone, game controller, or display; and integrate all the data to make decisions or provide input to the larger system since it can receive, process and send signals other than MEMS signals, from/to a PCB board for example. The MEMS chip also acts as a "smart" interposer between the PCB and the IC chip. Digital and/or analog signals can transit trough the MEMS chip to be processed by the auxiliary circuitry 1260, to be used by the MEMS transducers 1170 (for power signals for example), and can be transmitted back through the MEMS chip, or transmitted wirelessly.

The IC chip 1200 thus includes IC-electrical contacts, bump bonded to the MEMS-electrical contacts of the first cap layer 1120. The IC-electrical contacts are grouped in first and second sets of 1228, 1230, respectively bump bonded to the first and second sets 1124, 1126 of first cap MEMS-electrical contacts. It other words, the set 1128 of IC-electrical contacts are connected to the set 1124 of MEMS-electrical contacts, thereby connecting the first insulated conducting pathways 1130 to the MEMS signal processing circuitry 1240. The set 1230 of IC-electrical contacts are connected to the set 1126 of MEMS-electrical contacts, connecting the second insulated conducting pathways 1150 to the auxiliary signal processing circuitry 1260. Typically, the MEMS-electrical contacts of the first and second cap layers are bond pads.

Referring to FIG. 2A, another possible embodiment of an integrated MEMS system 2000 is shown. The exemplary 3DS MEMS chip 2100 is a hermetically sealed 9 degree-of-freedom (DOF) MEMS sensor chip, which includes a 6 DOF inertial sensor 2172 to measure x, y, and z acceleration and angular velocity and a 3 axis magnetometer 2176, all monolithically fabricated in the MEMS chip 2100.

The 6 DOF inertial sensor 2172 senses three axes of linear acceleration and three axes of angular rate. The 6 DOF inertial sensor 2172 includes first and second sets of electrodes 2180, 2182, respectively provided in the first and second cap layers 2120, 2140. One or several proof masses 2163, 2165 can be patterned in the central MEMS layer 2160, the first and second sets of electrodes 2180, 2182 forming capacitors with the proof mass(es). In FIG. 2A, only two proof masses 2163, 2165 are visible, but the 6 DOF inertial sensor 2172 can include more proof masses. The ultimate resolution of MEMS inertial sensors is set over short averaging times (<1 sec) by the noise density and over longer averaging times by the bias stability, which is roughly proportional to the noise density. The IMU noise density consists of two parts: an electrical noise density arising largely from the integrated circuit and a mechanical noise density arising from the MEMS sensor. A large MEMS sensor sensitivity, which is proportional for a gyroscope to the Coriolis force $2M\omega\Omega$ (where M is the mass, $\omega$ is the drive frequency, and $\Omega$ is the angular rate), or for an accelerometer to the linear force Ma (where M again is the mass and a is the acceleration), minimizes IC noise. The thermal noise of the MEMS sensor itself is inversely proportional to the mass. So a large mass is key to reducing overall noise. The 6 DOF inertial sensor 2172 has large proof masses 2163, 2165 and sense capacitors 2180 hermetically vacuum sealed at the wafer level. It is important to keep MEMS sensor area small for most applications, so the disclosed sensor system maximizes the inertial mass by increasing its thickness. Using the disclosed architecture, the inertial mass is typically 400 μm thick but can range from 100 μm thick to 1000 μm thick, as compared to other MEMS inertial sensors which are 40 μm thick or less. The large proof mass is typically fabricated in a Silicon-on-Insulator (SOI) wafer having a handle which can be 100-1000 μm thick, a buried oxide layer 1-5 μm thick, and a single crystal silicon (SCS) device layer that is 1-20 μm thick. The bulk of the proof mass is etched in the handle wafer using Deep Reactive Ion Etching (DRIE) of silicon.

The mass of the proof thus can be designed anywhere in the range of 0.1 to 15 milligrams by adjusting the lateral dimensions (0.5 mm to 4 mm, for example, or having an area in a range of 1-3 mm$^2$), thickness as described herein, or both. The springs which support the proof mass and the top of the mass are etched in the SCS device layer. The resonant frequency ($\sqrt{(k/M)}$) can be tuned separately by adjusting the spring constant k through the thickness of the device layer and the width and length of the spring. The spring constant k is proportional to $wt^3/L^3$, where w, t, and L are the width, thickness, and length respectively of the spring. Lower frequencies (long, thin springs) around 1000 Hz are desirable for the accelerometer, while higher frequencies (short, wide springs) are desirable for the gyroscopes. Generally, resonant frequencies between 500 Hz and 1500 Hz are used for a variety of applications. The capacitor electrodes and gaps are etched into the faces of the cap wafers which are bonded to the MEMS wafer. The gaps are typically 1-5 μm thick providing sense capacitors which can range from 0.1 to 5 picofarads. Further details concerning fabrication and operation of MEMS transducer devices can be found in U.S. patent application Ser. No. 14/622,619, filed on Feb. 13, 2015 (now U.S. Pat. No. 9,309,106) and U.S. patent application Ser. No. 14/622,548, filed on Feb. 13, 2015, the above referenced patent and applications being incorporated herein by reference in their entirety.

For industrial and tactical grade applications, which include high resolution motion capture and personal navigation, the thick mass and as-fabricated high quality factor (~5000) produce a gyroscope noise density ranging from 0.005 deg/√hr to 0.1 deg/√hr. The resulting gyroscope bias stability ranges between 0.05 deg/hr, and 1 deg/hr. This noise is lower than many fiber optic and ring laser gyroscopes that cost thousands of dollars more. Because existing consumer-grade MEMS gyroscopes use inexpensive packaging and have small inertial masses and sense capacitors, they have low quality factors and low angular rate sensitivities leading to large noise densities on the order of 1 deg/√hr and bias stability on the order of 10 deg/hr., inadequate for tactical and navigational use. Similarly, the accelerometer has a noise density ranging from 3 micro-g/√Hz to 30 micro-g/√Hz and bias stability ranging from 0.5 micro-g to 10 micro-g, much lower than consumer-grade accelerometers. The platform also allows the addition of other sensor types such as pressure sensors and magnetometers (shown here a 3 axis magnetometer 2176) to improve overall accuracy through sensor data fusion. The sensor data can be processed by data processor circuits integrated with the MEMS chip and IC chips as described herein, or by external processors. For navigation grade applications, which include high performance unmanned vehicle and autonomous navigation, two masses can be combined in an antiphase drive mode to not only increase the effective mass by a factor of √2, but to increase the quality factor by reducing mechanical energy losses. This approach can produce a gyroscope noise density ranging from 0.002 deg/√hr to 0.01 deg/√hr and bias stability ranging between 0.01 deg/hr, and 0.1 deg/hr.

The MEMS chip 2100 includes first and second insulated conducting pathways, 2130, 2150, similar to those described previously. The first insulated conducting pathways 2130 connect the MEMS electrodes 2180, 2182 to a first set 2124 MEMS-electrical contacts, on the first cap layer 2120. The second insulated conducting pathways 2150 extend through the entire thickness of the MEMS chip 2100, allowing the transmission of auxiliary (or additional) signals through the MEMS chip 2100. The second insulated conducting pathways 2150 connect a second set 2126 of MEMS-electrical contacts of the first cap layer 2120 to some of the MEMS-electrical contacts 2144 of the second cap layer 2140. For clarity, only some of the first insulated conducting pathways are indicated in FIG. 2A, such as pathways 2130a, 2130d extending between the second cap electrodes 2182 and MEMS-electrical contacts 2124 of the first cap layer 2120, and pathways 2130b and 2130c, connecting first cap electrodes 2180 patterned in the first layer 2120 with MEMS-electrical contacts 2126 of the same layer 2120. Similarly, only some of the second insulated conducting pathways are indicated in FIG. 2A, such as pathways 2150a and 2150b, connecting electrical contacts 2124, 2126 in the first cap layer 2120 with electrical contacts 2144 in the second cap layer 2140.

Referring to FIGS. 2B and 2C, enlarged portions of possible variants of insulated conducting pathways are shown. In FIG. 2B, the insulated pathway is formed by a closed-loop trench 28 surrounding a conductive wafer plug 26. The trench has its respective sidewalls lined with an insulating material 30, and filled with a conductive material 32. Alternatively, as in FIG. 2C, the trench can be completely filled with insulating material 30. For both variants, the conductive wafer plugs 26 allow transmitting electrical signals though the cap layer, to the electrical contacts 42. Of course, since the insulated conducting pathways can extend through the entire thickness of the MEMS chip, the central and second layers can be patterned in a similar fashion, with the trenches of the first, central and second layers being aligned at their layer interfaces.

Referring back to FIG. 2A, the single MEMS chip can also include transducer(s) which are non-inertial sensor(s). Examples of possible non-inertial sensors include pressure sensors, magnetometers, thermometers, microphones, micro-fluidic and micro-optic devices. Other types of non-inertial sensors are also possible. The non-inertial sensor includes non-inertial electrodes patterned in at least one of the first and second layers. The non-inertial sensor also includes at least one MEMS structure patterned in the central MEMS layer, which can include non-inertial electrodes. Example of MEMS structures in a non-inertial sensor include membranes, such as those used in pressure sensor, microphone or magnetometer. Some of the first insulated conducting pathways in the MEMS chip connect the non-inertial electrodes to at least some of the first cap MEMS-electrical contacts, so as to transmit signals from the non-inertial electrodes to the bond pads of the first layer of the MEMS chip, which is in turn connected to the IC chip.

In the embodiment of FIG. 2A, the non-inertial sensor is a three-axis magnetometer 2176, which can be used to improve the accuracy of the inertial sensor 2172. The IC-electrical contacts 2228, 2230 (such as IC I/O bond pads) of the single IC chip 2200 are bonded directly to the MEMS-electrical contacts 2126, 2124 (such as MEMS I/O bond pads) of the single MEMS chip 2100, reducing electrical noise and eliminating wire bonding. The magnetometer 2176 includes non-inertial electrodes, such as electrode 2184, and resonant membranes 2167, 2169.

Analog data can be communicated between the MEMS sensors 2172, 2176 and the IC chip 2200 at an analog-to-digital converter (ADC) input/output mixed signal stage of the IC chip 2200. The MEMS signals generated by the sensors 2172, 2176 are analog signals, so they are converted to digital by the ADC to be further processed in the digital CMOS portion of the IC chip 2200. The data processing of the MEMS signals by the IC chip 2200 can include sensor calibration and compensation, navigational calculations, data averaging, or sensor data fusion, for example. System control can be provided by an integrated microcontroller which can control data multiplexing, timing, calculations, and other data processing. Auxiliary (or additional) signals are transmitted to the IC chip via additional digital I/O. The IC chip 2200 includes auxiliary signal processing circuitry, such as for example wireless communications or GPS (Global Positioning System) functionality. The GPS data can also be used to augment and combine with MEMS sensor data to increase the accuracy of the MEMS sensor chip 2100. These are examples only, and more or fewer functions may be present in any specific system implementation. As can be appreciated, in addition to providing the analog sensing data via the MEMS signals, the MEMS chip 2100 can also provide an electronic interface, which includes power, analog and digital I/O, between the MEMS system 2000 and the external world, for example, a printed circuit board in a larger system.

Figure 2G:
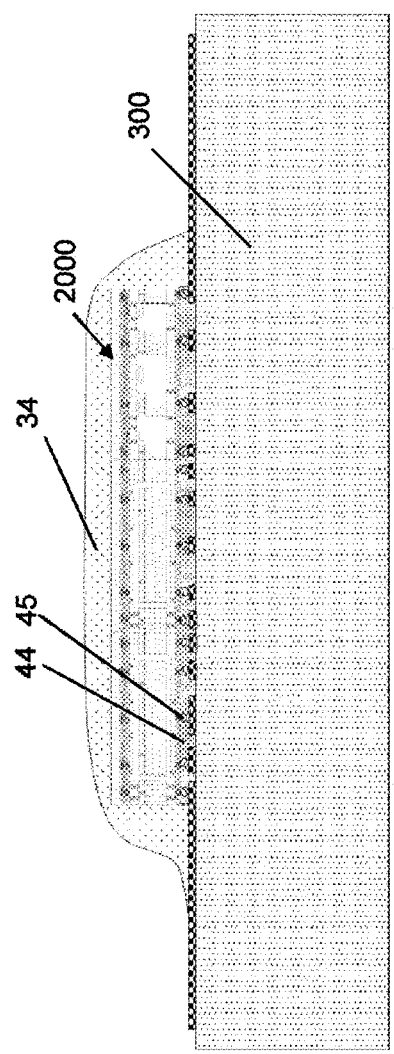
FIG. 2G is a schematic, cross-sectional view of the integrated MEMS system of FIG. 2A, bonded to a printed circuit board (PCB).

As per the embodiment shown in FIG. 2A, the single MEMS chip 2100 is integrated into the 3D MEMS System 2000 (3DS) and acts as both an active MEMS device and an interposer for signal distribution. One possible use of the 3DS architecture includes wafer-scale integration of the MEMS and IC, as schematically represented in FIGS. 2D to 2H.

FIG. 2D is a schematic representation of an IC wafer 200. An IC wafer can be constructed using any one of CMOS, Gallium Arsenide (GaAs) or other III-V compounds, Indium Phosphide (InP) or other II-VI compounds, Silicon Carbide, or other technologies. The IC wafer 200 includes several IC chips 2200. Each IC chip includes MEMS signal processing circuitry 2240 and auxiliary processing circuitry 2260, formed by IC transistors. The functionalities included in the IC chip can include GPS, RF, logic and/or memory. The IC wafer 200 also includes inter-level metal interconnects, and IC-electrical contacts, typically bond pads. The IC-electrical contacts are grouped in first and second sets of contacts 2228, 2230: the IC-contacts of the first set 2228 are designed to connect with MEMS-electrical contacts linked to the first insulated pathways, and the second set 2230 are designed to connect with MEMS-electrical contacts linked to the second insulated pathways.

FIG. 2E is a schematic representation of a multi-wafer stack 100, including several single MEMS chips, such as MEMS chip 2100 of FIG. 2A. The ASIC wafer 200 of FIG. 2D and the MEMS multi-wafer stack 100 of FIG. 2E can be fabricated in separate MEMS and IC foundries, in order to take advantage of existing processes to minimize cost and increase yield. In this example, two IC chips and two MEMS chips are shown, before dicing.

During the fabrication process of the MEMS stack 100, channels are etched in the first and second layers to define the borders of electrodes, leads, and feedthroughs on the inward-facing surfaces of the first and second silicon wafers. The channels are then lined, or filled, with an insulating material such as thermal oxide or CVD (Chemical Vapor Deposition) silicon dioxide. Both sides of the central MEMS wafer, which is typically an SOI wafer, are patterned with electrodes and MEMS structures, such as membranes and proof masses. Conductive shunts are formed in specific locations in the buried oxide layer, to allow electrical signals to pass from the device to the handle layer, through what will become the insulated conducting pathways. The central and cap MEMS wafers are also patterned with respective frames enclosing the MEMS structures. The various conducting pathways required by the device are constructed by aligning feedthrough structures on each level. The portion of the insulated conducting pathways in the central MEMS wafer can be isolated either by insulator-filled channels or by etched open trenches since the MEMS wafer is completely contained within the stack and the isolation trenches do not have to provide a seal against atmospheric leakage like the cap trenches. The frames are also bonded so as to form hermetically sealed chambers around the MEMS structures. After the wafer stack 100 is assembled, the cap wafers are ground and polished to expose the isolated conducting regions.

FIGS. 2D-2F illustrate a preferred way of bonding the MEMS and IC wafer 100, 200. An underfill 44 is applied to the top side CMOS wafer 200 and patterned to expose the IC electrical contacts (bond pads in this case). Solder bumps 45 are deposited on the bond pads. The IC wafer 200 is flipped and aligned to the MEMS wafer 100, such that the IC bond pads and solder bumps are aligned to the bond pads of the first cap wafer. The IC wafer 200 is bonded to the MEMS wafer 100 using temperature and pressure to produce a MEMS integrated system wafer.

The bonded 3DS wafer can now be diced (along the dotted lines in FIG. 2F) into individual integrated MEMS system components, also referred as 3D System on Chip (3DSoC). The exposed side of the IC chip is protected by an oxide passivation layer applied on the silicon substrate, and the MEMS/ASIC interface is protected by an underfill 44. The diced chips 2000 can be treated as packaged ICs and the bottom cap bond pads provided on the second cap can be bump bonded to the bond pads on a PCB 300, with no additional packaging, as shown in FIG. 2G. A PCB underfill 44 is applied to the PCB and patterned to clear contacts over the PCB bond pads. Solder bumps 45 are applied to the exposed PCB bondpads and the diced 3DS component chip 2000 can be flip chip bonded to the PCB 300. If additional moisture protection is desired, a polymeric encapsulant or other material 34 can be applied. No additional capping or bond wires are required.

Figure 3:
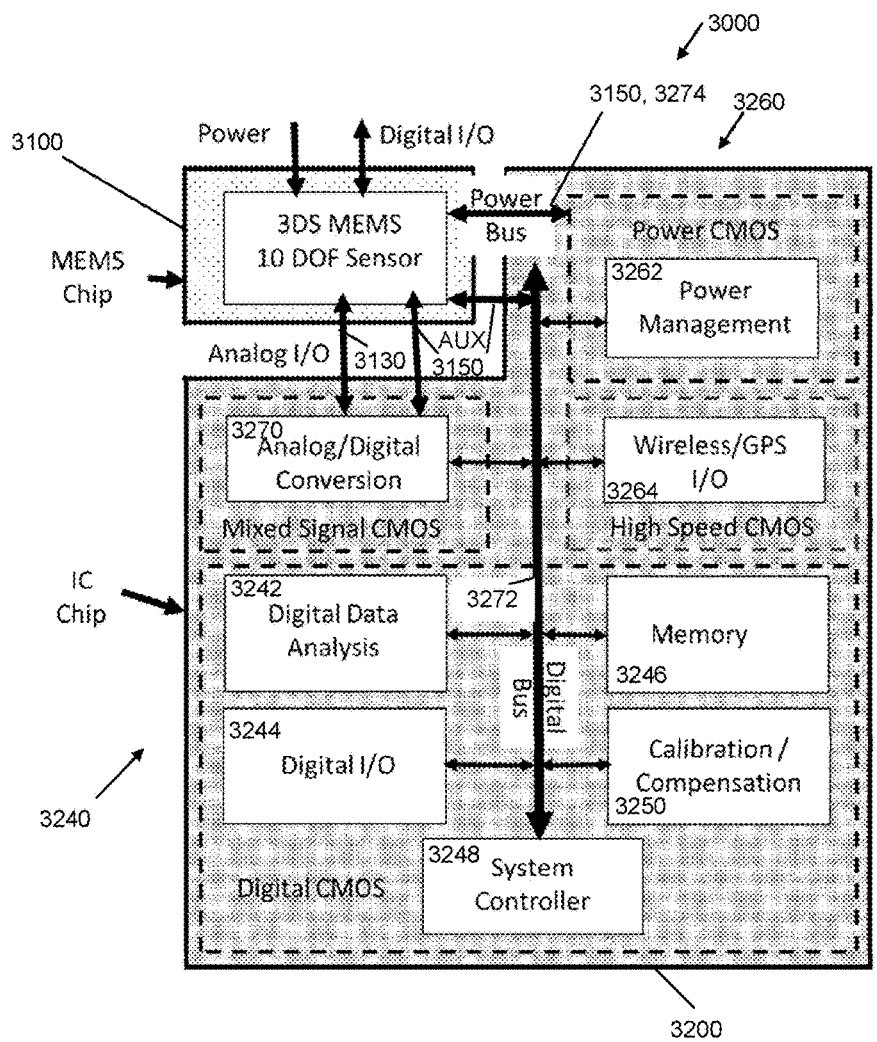
FIG. 3 is a schematic representation of an integrated MEMS system, according to a possible embodiment.

FIG. 3 is a block diagram representing a possible embodiment of an integrated MEMS system, in this case a 10-DOF IMU system 3000. The system 3000 includes a 10-DOF single MEMS chip 3100, and a single IC chip 3200, the MEMS chip and the IC chip having architecture similar to that described for the system 2000 of FIG. 2A. The MEMS chip 3100 comprises top cap, central MEMS and bottom cap layers, with transducers patterned in the layers. The transducers can include a three-axis accelerometer, gyroscope and magnetometer, as well as a pressure sensor. First and second insulated conducting pathways 3130, 3150 are formed within the MEMS layers to transmit MEMS-signals and auxiliary signals. The insulated conducting pathways 3130, 3150 connect to MEMS-electrical contacts on the first and/or second cap layers. A single IC chip 3200 is bump bonded to the first layer of the MEMS chip, and includes MEMS-signal processing circuitry 3240, and auxiliary-processing circuitry 3260. The MEMS-signal processing circuitry processes the transducers' I/O signals, i.e. signals generated by the transducers and/or signals for controlling the transducers. The auxiliary-processing circuitry 3260 processes auxiliary signals, i.e. signals transiting through the second insulating pathways of the MEMS chip 3100, such as signals for powering the transducers and/or digital signals for controlling the transducers.

In the present embodiment, the MEMS-signal processing circuitry 3240 includes specialized digital CMOS circuitry modules such as digital data analysis circuitry 3242, digital input/output circuitry 3244, memory 3246, a system controller 3248 and calibration/compensation circuitry 3250. The auxiliary signal processing circuitry 3260 includes power management circuitry 3262, and high speed CMOS circuitry 3264 which may include wireless and/or GPS I/O modules. The digital components in the MEMS-signal processing circuitry 3240 and in the auxiliary signal processing circuitry 3260 communicate over a digital bus 3272.

Since the transducers operate using analog signals, the IC chip 3200 includes mixed-signal CMOS circuitry 3270 to allow the IC chip 3200 to interface with the input and output of the MEMS sensor 3100. The mixed-signal CMOS circuitry 3270 includes an ADC to convert analog signals generated by the MEMS chip 3100 into digital signals for processing by the MEMS signal processing circuitry 3240. The mixed-signal CMOS circuitry 3270 also includes a DAC for converting digital signals received from the MEMS-signal processing circuitry 3240 and/or auxiliary signal processing circuitry 3260 into analog signals for controlling the MEMS chip 3100. The mixed-signal CMOS circuitry 3270 communicates with the other digital components of the IC chip 3200 over the digital bus 3272.

The 3DS sub-systems are distributed among these various circuits. For example, consider a 3DS Inertial Navigation Unit (INU) based on a 10 DOF MEMS sensor consisting of a 6DOF inertial sensor measuring angular rate and acceleration, a pressure sensor, and a 3DOF magnetometer as illustrated in FIG. 3. Part of the 3DS system can act as a system sensor hub when digital request for a position/attitude reading from a larger system comes in through the PCB board Digital I/O leads or wireless I/O 3264 which requires high-speed or RF CMOS running at higher clock rates than the memory or logic sections. The request travels through the Digital Bus 3272 and Digital I/O section 3244 to the system controller 3248. The system controller 3248 would provide the clock signals to trigger and time the measurements of each of the 3 angular rate, 3 acceleration, 3 magnetic field, and 1 pressure reading. The Analog/Digital section 3270 provides the DC bias and gyroscope drive signals required to measure the capacitances of the various sensors, as well as amplify the signals and convert them into digital data representing angular rate, acceleration, magnetic field, and pressure. The Digital Analysis circuitry 3242 can take the raw digital sensor data and using algorithms and constants stored in memory 3246 calculate real-time values of acceleration and angular rate (IMU output), as well as pressure and magnetic field. However, if an inertial navigation output (e.g. position and attitude) are required the Digital Data Analysis section 3242 will perform additional calculations to integrate the 6DOF data with the pressure and magnetic field data along with external sensor readings (such as GPS) to provide instantaneous position and attitude. These "sensor fusion" algorithms and constants can be stored in memory 3246. Finally the results are output through the Digital I/O section 3244 through the Digital Bus either through the MEMS chip to the PCB board or via RF wireless radio with the 3DS chip acting again as a sensor hub to communicate with the larger system.

As illustrated, the IC 3200 interfaces with the MEMS chip 3100 via the conducting pathways 3130 and 3150. The first conducting pathways 3130 conduct the transducers' I/O signals and are therefore analog channels. The first pathways 3130 therefore travel through the mixed-signal CMOS circuitry 3270 interface before reaching the digital bus 3272. The second conducting pathways 3150 conduct the auxiliary signals. Since the auxiliary signals could be analog or digital, they may take different paths into the IC chip 3200 depending on their function. For example an analog auxiliary signal could interface with the IC chip 3200 via the mixed-signal CMOS circuitry 3270, while a digital signal could interface directly with the digital bus 3272. If a second conducting pathway 3150 is carrying a power signal, it could act as a power bus 3274 and interface directly with the power management circuitry 3262, for example, with the power management circuitry 3262 also being connected to the digital bus 3272 for communicating digital data.

Figure 4A:
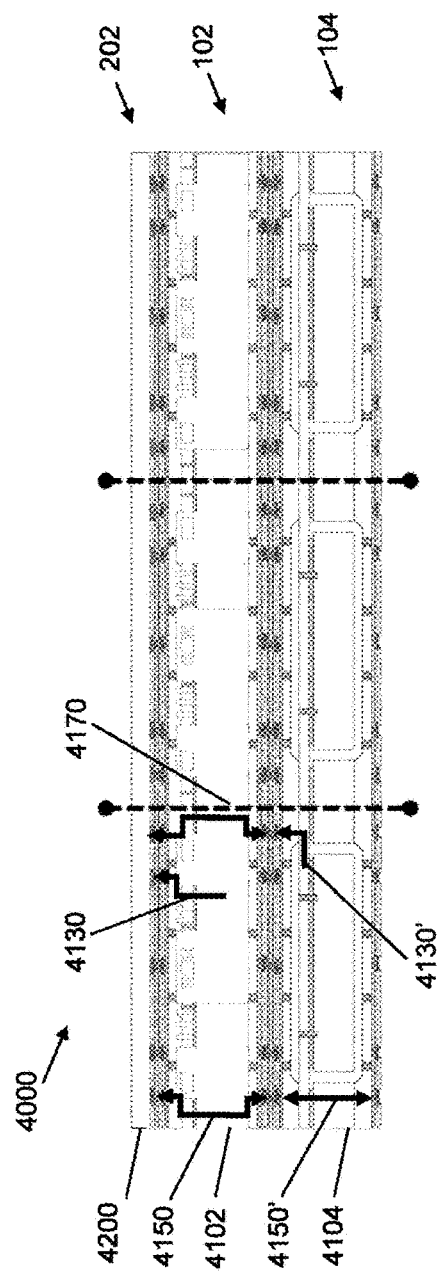
FIG. 4A is a schematic cross-sectional view of an IC wafer and two MEMS wafer stack, bonded at the wafer level.
Figure 4B:
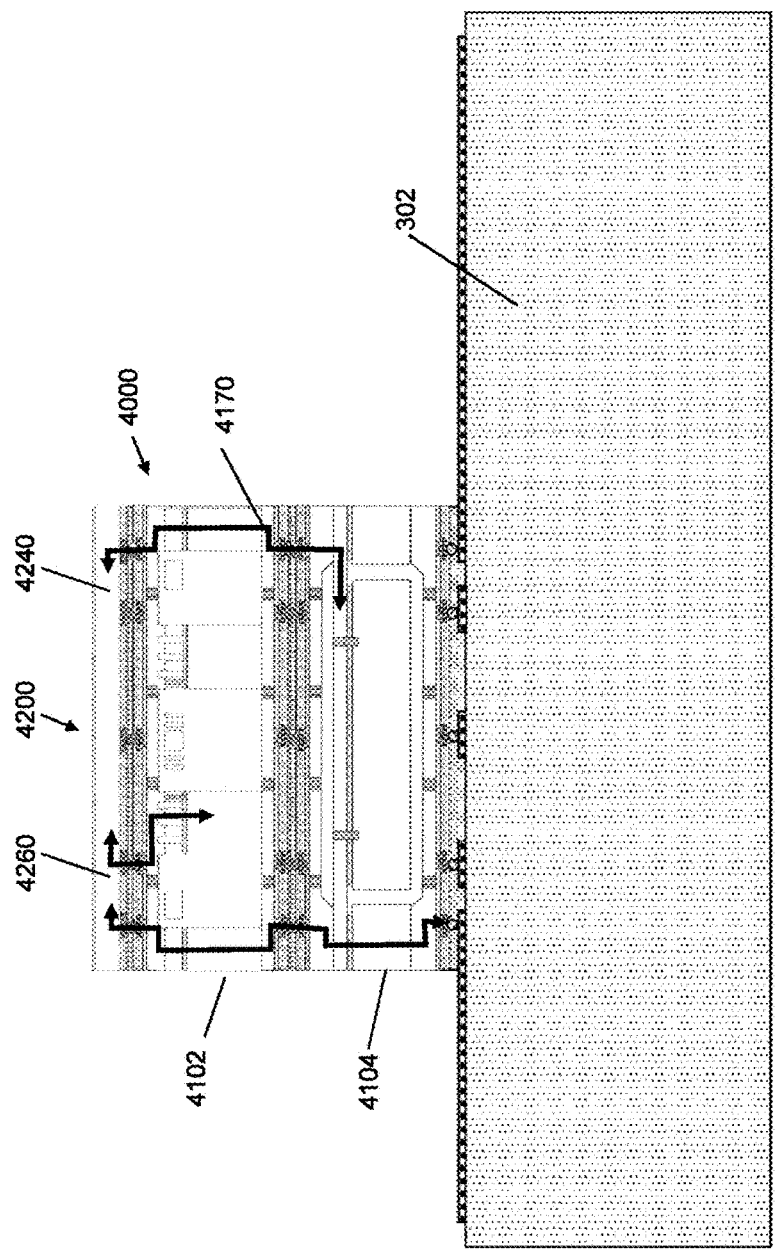
FIG. 4B is a schematic, cross-sectional view of an integrated MEMS system, according to a possible embodiment, shown bonded to a PCB.

Referring to FIG. 4A, to reduce the final device footprint area, an alternative architecture of the MEMS integrated system enables multiple single MEMS wafers 102, 104 to be stacked vertically, to form the 3DS MEMS wafer. FIG. 4A shows an IC-wafer 202 bonded to a multi-wafer 3DS MEMS consisting of two MEMS wafers 102, 104 of different device types, stacked and bonded to each other. By aligning the first and second insulated conducting pathways (also referred as 3DTCVs), MEMS and auxiliary signals can be routed through the entire stack of MEMS and ASIC chips, simplifying power bussing and minimizing lead routing between the various MEMS functions and the electronics. FIG. 4B shows the diced 3DS component 4000 consisting of a stack of an IC chip 4200 and two single MEMS chips 4102, 4104 bump bonded to a printed circuit board 302. In this case, the second layer of the single MEMS chip 4102 is bump bonded to the first layer of the additional single MEMS chip 4104. The second insulated conducting pathways 4150' of the additional single MEMS chip 4104 is electrically connected to at least some of the second insulated conducting pathways 4150 of the first single MEMS chip 4102, to conduct auxiliary signals through the first and the additional single MEMS chip, to the auxiliary-signal processing circuitry of the IC chip 4200. The interconnected second insulated conducting pathways of the MEMS chips 4102 and 4104 allows to send auxiliary signals from the PCB up to the IC chip for processing, without requiring any wire-bonding.

MEMS signals for the MEMS chip 4104 can also transit trough the MEMS chip 4102, up to the IC chip 4200. The first MEMS chip 4102 comprises a third set of first cap MEMS-electrical contacts and third insulated conducting pathways 4170 to connect the first cap MEMS-electrical contacts of the third set to at least some of the second cap MEMS-electrical contacts of the second cap layer of MEMS chip 4102, through the first cap layer, the central MEMS layer and the second cap layer. These third insulated conducting pathways 4170 are electrically connected to the MEMS signal processing circuitry 4240 of the IC chip 4200, and are electrically connected to insulated conducting pathways 4130' of MEMS chip 4104. The MEMS signal processing circuitry 4240 can thus process the electrical MEMS signals of the first and of said at least one additional single MEMS chips. The MEMS-signal processing circuitry 4240 can thus process MEMS-signals from both MEMS chips 4102 and 4104.

Of course, while in the embodiment shown in FIGS. 4A and 4B there are two MEMS chips, it is possible to stack more than two MEMS chips of the same or of different types. An integrated MEMS system component can thus include a first single MEMS chip and additional single MEMS chips, stacked vertically.

Figure 5A:
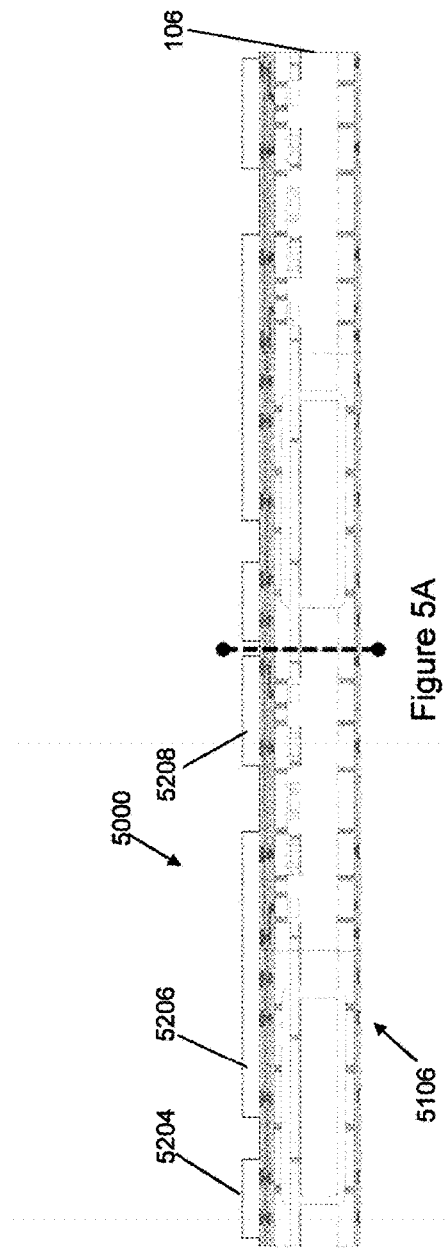
FIG. 5A is a schematic cross-sectional view of a MEMS wafer stack and of several IC chips, bump bonded to the MEMS wafer stack.
Figure 5B:
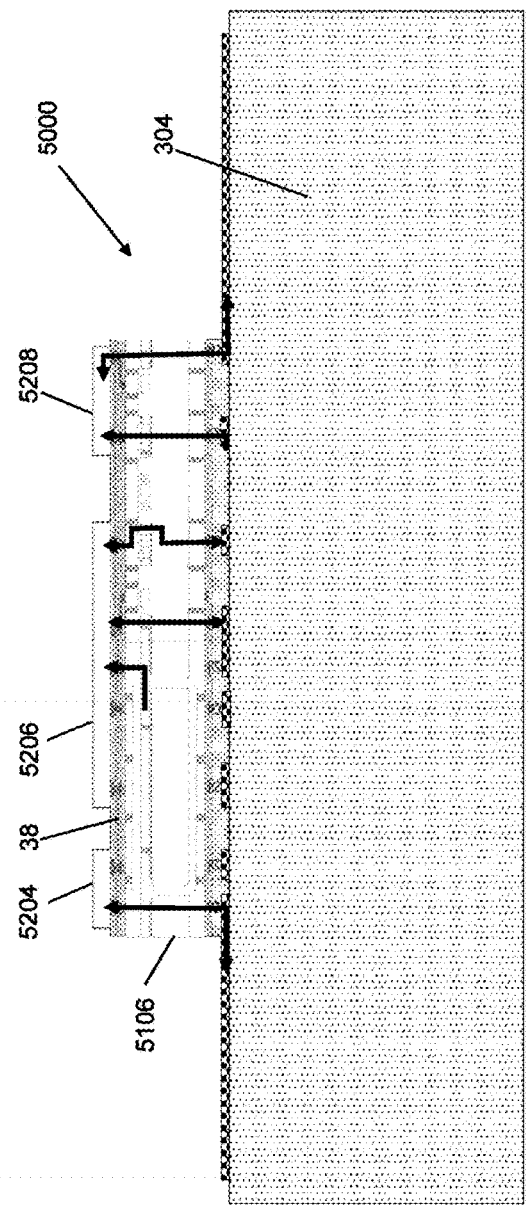
FIG. 5B is a schematic, cross-sectional view of an integrated MEMS system, according to another possible embodiment, shown bonded to a PCB.

Referring to FIGS. 5A and 5B, if the variation in IC types is too complex to be accommodated by a single ASIC (for example, mixed signal functions plus GPS functions, plus radio-frequency (RF) functions), the MEMS wafer stack 106 can be used as a 3DS substrate with a first IC chip to process MEMS and auxiliary signals, and additional IC chips 5204, 5206, 5208 of the desired types, such as GPS, RF, logic, processor, memory, and bump bonded to the one of the cap wafers of multi-wafer stack 106. Rather than using wafer bonding to attach a single ASIC wafer to the MEMS wafer stack, PCB chip attachment methods such as pick and place and solder bump attachment are used to align and bond the IC bond pads to the MEMS solder bumps, as in FIG. 5A. Each IC chip is thus individually placed and bonded to the MEMS wafer to form a 3D System Wafer (3DS wafer), the 3DS wafer being singulated into individual 3D System in Package (3DSiP) chips.

Referring to FIG. 5B, the MEMS metallization layer 38 in this case serves not only to connect the MEMS chip 5106 to the various ICs 5204, 5206, 5208, but also functions to interconnect the ICs and to provide signal and power distribution for them. In either case, after dicing, the individual 3DS components 5000 can be treated as a completed system chip, with no additional packaging or wire bonding. The system chip 5000 can be bump bonded to a PC board 304.

Figure 6A:
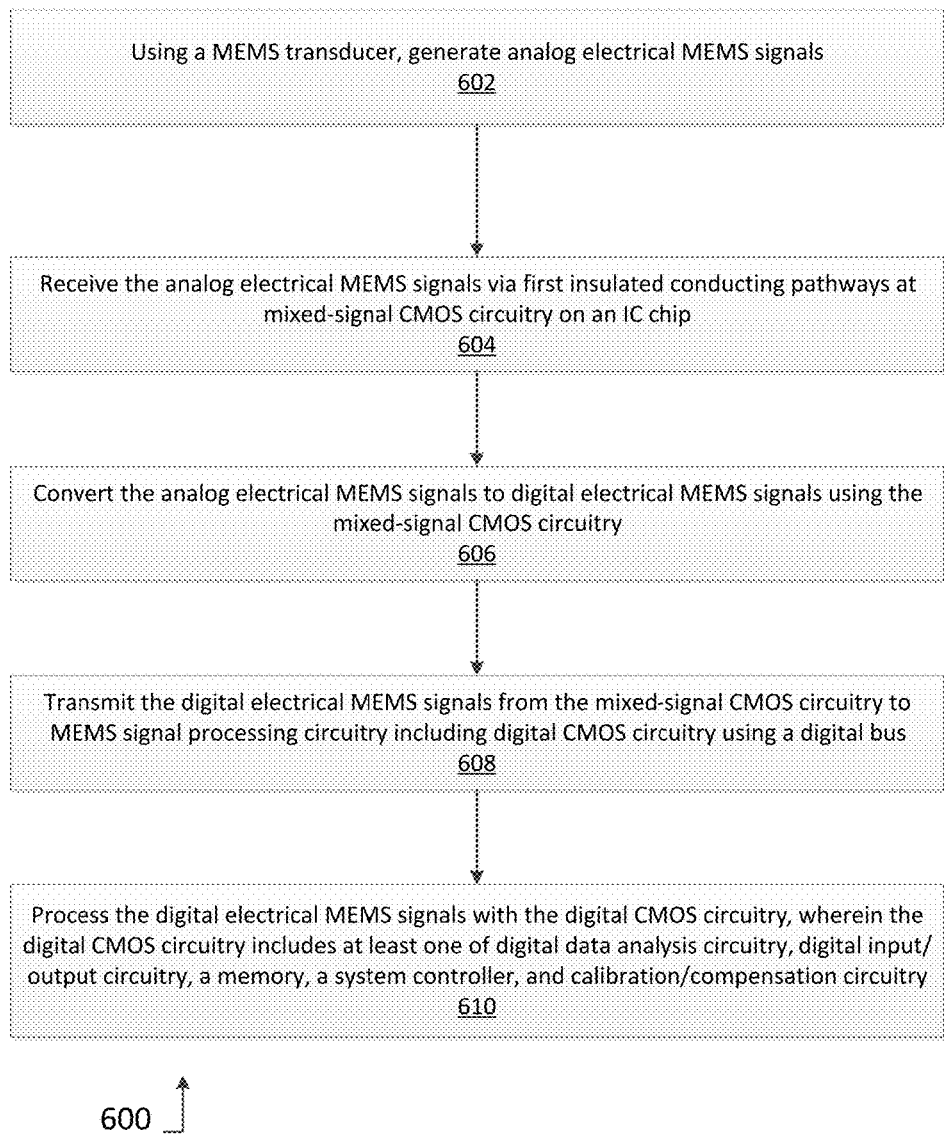
FIG. 6A is a process flow diagram illustrating a method of operating a MEMS transducer device in accordance with preferred embodiments of the invention.

Referring to FIG. 6A, a process flow diagram is illustrated that describes a method 600 of operating a MEMS transducer device. Analog electrical MEMS signals are generated using a MEMS transducer (step 602). The analog electrical MEMS signals are received via first insulating conducting pathways at mixed-signal CMOS circuitry on an IC chip (step 604). The mixed-signal CMOS circuitry converts the analog electrical MEMS signals to digital electrical MEMS signals (step 606). The digital electrical MEMS signals are transmitted from the mixed-signal CMOS circuitry to MEMS signal processing circuitry including digital CMOS circuitry using a digital bus (step 608). The digital CMOS circuitry processes the digital electrical MEMS signals (step 610). The digital CMOS circuitry includes at least one of digital data analysis circuitry, digital input/output circuitry, a memory, a system controller, and calibration/compensation circuitry.

Figure 6B:
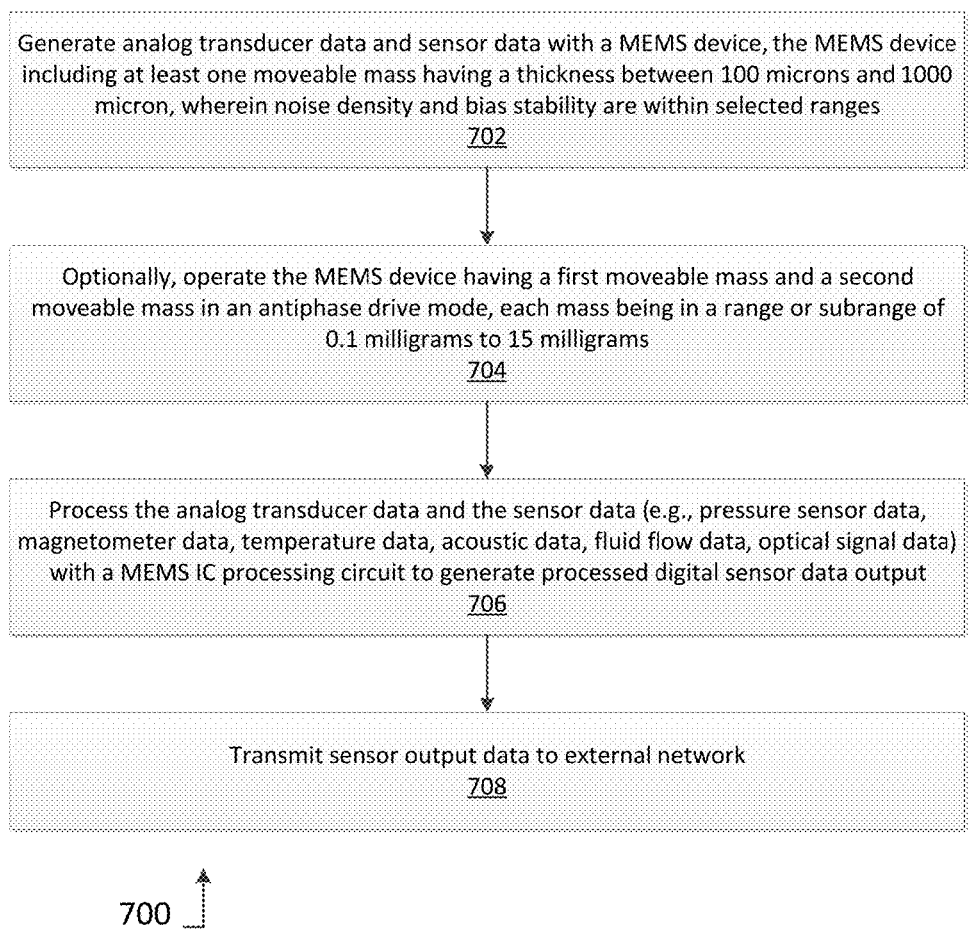
FIG. 6B is a process flow diagram illustrating a method of operating a proof mass MEMS device in accordance with preferred embodiments of the invention.

Referring to FIG. 6B, a process flow diagram illustrated that describes a method 700 of operating a proof mass MEMS device in accordance with preferred embodiments of the invention. Transducer data and sensor data are generated with a MEMS device (step 702). The MEMS device includes at least one moveable mass having a thickness between 100 microns and 1000 microns. The mass area and thickness are chosen to provide noise density and bias stability values within selected ranges. Optionally, the MEMS device having a first moveable mass and a second moveable mass is operated in an antiphase drive mode (step 704). A plurality of masses are selected to reduce noise. The transducer data and the sensor data are processed with a MEMS IC processing circuit to generate digital sensor data output (step 706) as described herein. The device can then transmit to sensor output data by wired or wireless transmission to an external application by a communication network.

The scope of the claims should not be limited by the preferred embodiments set forth in the examples, but should be given the broadest interpretation consistent with the description as a whole including any equivalents.

The invention claimed is:

1. An integrated micro-electro-mechanical (MEMS) system comprising:
at least one MEMS chip comprising:
a first cap layer including a first set and a second set of first cap MEMS electrical contacts;
a second cap layer comprising second cap MEMS electrical contacts;
a central MEMS layer located between the first cap layer and the second cap layer;
at least one transducer formed in the first cap layer, the central MEMS layer and the second cap layer, the at least one transducer producing motion or sensing at least one parameter;
first insulated conducting pathways connecting said at least one transducer to the first set of first cap MEMS electrical contacts, the first insulated conducting pathways conducting electrical MEMS signals between said at least one transducer and the first set of the first cap MEMS electrical contacts; and
second insulated conducting pathways connecting the second set of first cap MEMS electrical contacts to at least one of the second cap MEMS electrical contacts, the second insulated conducting pathways extending through the first cap layer, the central MEMS layer, and the second cap layer, for conducting further signals through the MEMS chip; and
at least one signal integrated circuit (IC) chip comprising:
a first set and a second set of IC electrical contacts, the first set of IC electrical contacts being bonded to the first set of first cap MEMS electrical contacts and the second set of IC electrical contacts being bonded to the second set of first cap MEMS electrical contacts;
MEMS signal processing circuitry, operatively connected to the first set of IC electrical contacts, the MEMS signal processing circuitry configured to process the electrical MEMS signals; and
second signal processing circuitry, operatively connected to the second set of IC electrical contacts, the second signal processing circuitry configured to process the further signals.

2. The integrated MEMS system according to claim 1, wherein the first cap layer, the central MEMS layer and the second cap layer are made of an electrically conducting material, the first cap layer being electrically bonded to a first side of the central MEMS layer, and the second cap layer being electrically bonded to a second side of the central MEMS layer, opposite the first side.

3. The integrated MEMS system according to claim 1, wherein the first cap layer, the central MEMS layer and the second cap layer are fabricated from respective silicon wafers bonded at wafer level.

4. The integrated MEMS system according to claim 1, wherein the central MEMS layer comprises a silicon on insulator wafer and includes a moveable mass in a range of 0.5-1.5 milligrams, or in a range of 1.5-3 milligrams or in a range of 3-6 milligrams.

5. The integrated MEMS system according to claim 1, wherein the second insulated conducting pathways are formed by one or more trenches etched in at least one of the first layer, the central MEMS layer and the second layer, said one or more trenches being aligned and filled with an insulating material, the one or more trenches surrounding respective conductive wafer plugs, the conductive wafer plugs configured to transmit electrical signals though the entire thickness of the MEMS chip.

6. The integrated MEMS system according to of claim 1, wherein at least a plurality of the second insulated conducting pathways are formed by trenches etched in one of the first layer, the central MEMS layer and the second layer, said trenches being aligned and having their respective sidewalls lined with an insulating material and filled with a conductive material.

7. The integrated MEMS system according to claim 1, wherein the first MEMS electrical contacts and second cap MEMS electrical contacts of the first cap layer and the second cap layer are bond pads.

8. The integrated MEMS system according to claim 1, wherein said at least one transducer comprises a six degree of freedom motion sensor, and wherein said at least one parameter comprises three axes of linear acceleration and three axes of angular rate.

9. The integrated MEMS system according to claim 8, wherein said six degree of freedom motion sensor comprises a first set of electrodes and a second set of electrodes, the first set of electrodes positioned in the first cap layer and the second set of electrodes positioned in the second cap layer and a plurality of proof masses positioned in the central MEMS layer, the first and second sets of electrodes forming capacitors with the plurality of proof masses, a plurality of the first insulated conducting pathways configured to connect the first set of electrodes and the second set of electrodes to at least a plurality of the first cap MEMS electrical contacts of the first set of MEMS electrical contacts.

10. The integrated MEMS system according to claim 1, wherein said at least one transducer comprises at least one non-inertial sensor.

11. The integrated MEMS system according claim 10, wherein said at least one non-inertial sensor comprises at least one of a pressure sensor, a magnetometer, a thermometer, and a microphone.

12. The integrated MEMS system according to claim 10, wherein said at least one non-inertial sensor comprises non-inertial electrodes patterned in the first layer and at least one MEMS structure patterned in the central MEMS layer, a plurality of the first insulated conducting pathways connect said electrodes of the at least one non-inertial sensor to at least one of the first set of first cap MEMS electrical contacts.

13. The integrated MEMS system according to claim 1, wherein at least one of the electrical MEMS signals are analog signals, the IC chip comprising mixed signal CMOS circuitry to convert analog signals transmitted by the MEMS chip into digital signals, the digital signals being processed by the MEMS signal processing circuitry, and wherein the mixed signal CMOS circuitry is configured to convert digital signals transmitted by the MEMS signal processing circuitry into analog signals for connection to the MEMS chip.

14. The integrated MEMS system according to claim 1, wherein the IC chip comprises a digital bus, the MEMS signal processing circuitry comprising digital CMOS circuitry connected to said mixed signal circuitry via said digital bus.

15. The integrated MEMS system according to claim 14, wherein the digital CMOS circuitry comprises at least one of: a digital data analysis circuitry, a digital input/output circuitry, a memory, a system controller and a calibration/compensation circuit.

16. The integrated MEMS system according to claim 14, wherein the IC chip comprises a power bus and wherein the further signal processing circuitry comprises power management circuitry connected to the power bus and to the digital bus.

17. The integrated MEMS system according to claim 14, wherein the IC chip comprises high speed CMOS circuitry connected to the digital bus, for processing the further signals.

18. The integrated MEMS system according to claim 17, wherein the high speed CMOS circuitry comprises at least one of an input-output module for wireless or GPS signals.

19. The integrated MEMS system according to claim 1, wherein said at least one single MEMS chip comprises a first single MEMS chip and at least one additional single MEMS chip, the first single MEMS chip and said at one additional single MEMS chip being stacked vertically, the second layer of the first single MEMS chip being bump bonded to the first layer of said at least one additional single MEMS chip, the second insulated conducting pathways of said at least additional single MEMS chip being electrically connected to at least one of the second insulated conducting pathways of the first single MEMS chip, for conducting auxiliary signals through the first MEMS chip and said at least one additional single MEMS chip, to the at least one IC chip.

20. The integrated MEMS system according to claim 19, wherein the first MEMS chip comprises a third set of first cap MEMS electrical contacts and third insulated conducting pathways connecting the first cap MEMS electrical contacts of the third set to at least some of the second cap MEMS electrical contacts, through the first cap layer, the central MEMS layer and the second cap layer, said third insulated conducting pathways being electrically connected to the MEMS signal processing circuitry of the at least one IC chip, and being electrically connected to insulated conducting pathways of said at least one additional single MEMS chip, the MEMS signal processing circuitry processing the electrical MEMS signals of the first MEMS chip and of said at least one additional single MEMS chips.

21. The integrated MEMS system according to claim 1, wherein said at least one single IC chip comprises a first single IC chip and at least one additional single IC chip.

22. The integrated MEMS system according to claim 1, further comprising a first proof mass having a thickness in a range of 100 microns to 1000 microns.

23. The integrated MEMS system according to claim 22, further comprising a second proof mass having a thickness in a range of 100 microns to 1000 microns.

24. The integrated MEMS system according to claim 23, further comprising a controller configured to operate the first proof mass and the second proof mass in an antiphase drive mode.

* * * * *